US009293180B2

(12) United States Patent
Jeong et al.

(10) Patent No.: US 9,293,180 B2
(45) Date of Patent: Mar. 22, 2016

(54) MEMORY DEVICE, MEMORY SYSTEM, AND OPERATION METHOD THEREOF

(71) Applicant: Samsung Electronics Co., Ltd., Suwon-si (KR)

(72) Inventors: Eui-chul Jeong, Yongin-si (KR); Sung-hee Lee, Osan-si (KR); Dae-sin Kim, Hwaseong-si (KR); Seung-hwan Kim, Hwaseong-si (KR); Dae-sun Kim, Hwaseong-si (KR); Sua Kim, Seongnam-si (KR); Dong-soo Woo, Seoul (KR); Na-ra Kim, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 14 days.

(21) Appl. No.: 14/290,236

(22) Filed: May 29, 2014

(65) Prior Publication Data
US 2014/0362637 A1 Dec. 11, 2014

(30) Foreign Application Priority Data

Jun. 5, 2013 (KR) ........................ 10-2013-0064962

(51) Int. Cl.
| G11C 11/4074 | (2006.01) |
| G11C 8/08 | (2006.01) |
| G11C 8/18 | (2006.01) |
| G11C 11/408 | (2006.01) |
| G11C 29/04 | (2006.01) |

(52) U.S. Cl.
CPC .. *G11C 8/08* (2013.01); *G11C 8/18* (2013.01); *G11C 11/4085* (2013.01); *G11C 2029/0411* (2013.01); *G11C 2207/2227* (2013.01)

(58) Field of Classification Search
None
See application file for complete search history.

(56) References Cited

U.S. PATENT DOCUMENTS

| 5,691,230 | A | * | 11/1997 | Forbes | ........................... | 438/412 |
| 5,719,818 | A | * | 2/1998 | Tovim | ...................... | G11C 8/10 |
| | | | | | | 326/106 |
| 6,091,094 | A | * | 7/2000 | Rupp | ............................ | 257/296 |
| 7,764,555 | B2 | | 7/2010 | Chang et al. | | |
| 7,902,026 | B2 | | 3/2011 | Chung et al. | | |
| 7,978,552 | B2 | | 7/2011 | Matsuoka et al. | | |
| 8,259,529 | B2 | | 9/2012 | Lee et al. | | |

(Continued)

FOREIGN PATENT DOCUMENTS

| JP | 200209258 | 1/2002 |
| KR | 100819645 | 3/2008 |

(Continued)

*Primary Examiner* — James G Norman
(74) *Attorney, Agent, or Firm* — Onello & Mello LLP

(57) ABSTRACT

A memory device comprises: a memory cell array comprising first and second word lines located adjacent to each other, a first memory cell connected to the first word line, and a second memory cell connected to the second word line and located adjacent to the first memory cell; and a word line voltage supplying unit that transitions a word line voltage of the first word line from a first word line voltage to a second word line voltage, in response to a first control signal. A transition control unit generates the first control signal for controlling a pulse of the word line voltage of the first word line in a transition period from the first word line voltage to the second word line voltage in such a way that a transition waveform profile from the first word line voltage to the second word line voltage is different from a transition waveform profile from the second word line voltage to the first word line voltage.

18 Claims, 21 Drawing Sheets

(56) References Cited

U.S. PATENT DOCUMENTS 8,274,853 B2 9/2012 Lee
2009/0148991 A1 6/2009 Chung et al.
2011/0286262 A1 11/2011 Kitayama

FOREIGN PATENT DOCUMENTS

KR 2011003676 1/2011
KR 101179193 8/2012

* cited by examiner

MEMORY DEVICE, MEMORY SYSTEM, AND OPERATION METHOD THEREOF

CROSS-REFERENCE TO RELATED APPLICATION

This application claims the benefit of Korean Patent Application No. 10-2013-0064962, filed on Jun. 5, 2013, in the Korean Intellectual Property Office, the disclosure of which is incorporated herein in its entirety by reference.

BACKGROUND

Inventive concepts relate to a memory device, a memory system, and an operation method thereof, and more particularly, to a memory device, a memory system, and an operation method thereof, capable of reducing power consumption and size, increasing operation speed, and improving reliability.

There is continuous pressure from the electronics industry for memory devices and memory systems to increase storage capacity and operation speed. It is further required that memory devices and memory systems reduce power consumption and size, and improve reliability. Various approaches capable of satisfying all of the above conflicting demands are being developed and applied to memory devices and memory systems.

SUMMARY

Inventive concepts provide a memory device, a memory system, and an operation method thereof, capable of reducing power consumption and size, increasing operation speed, and improving reliability.

According to an aspect of the inventive concepts, a memory device comprises: a memory cell array comprising first and second word lines located adjacent to each other, a first memory cell connected to the first word line, and a second memory cell connected to the second word line and located adjacent to the first memory cell; a word line voltage supplying unit that transitions a word line voltage of the first word line from a first word line voltage to a second word line voltage, in response to a first control signal; and a transition control unit that generates the first control signal for controlling a pulse of the word line voltage of the first word line in a transition period from the first word line voltage to the second word line voltage in such a way that a transition waveform profile from the first word line voltage to the second word line voltage is different from a transition waveform profile from the second word line voltage to the first word line voltage.

In some embodiments, the first word line voltage is a selected word line voltage, and the second word line voltage is a non-selected word line voltage.

In some embodiments, the transition control unit generates the first control signal so that a time period taken to transition the first word line voltage to the second word line voltage is longer than a time period taken to transition the second word line voltage to the first word line voltage.

In some embodiments, the memory device is a dynamic random access memory (DRAM) device, and the time period taken to transition the first word line voltage to the second word line voltage is set to correspond to a row cycle time set with respect to the memory device.

In some embodiments, the time period taken to transition the first word line voltage to the second word line voltage is set to be equal to or longer than ½ of a time period from a first time point for starting to transition the first word line voltage to the second word line voltage, to a second time point for ending a row pre-charge time of the first word line.

In some embodiments, the word line voltage supplying unit comprises a delay unit that delays the transition period from the first word line voltage to the second word line voltage, in response to the first control signal.

In some embodiments, the transition control unit generates the first control signal so that the first word line voltage is reduced sequentially over n sub word line voltages (n is a positive integer) during transition to the second word line voltage.

In some embodiments, the transition control unit generates the first control signal so that the second word line voltage is linearly increased during transition to the first word line voltage.

In some embodiments, the word line voltage supplying unit comprises a voltage divider that divides the first word line voltage sequentially to the n sub word line voltages in response to the first control signal.

In some embodiments, each of the first and second memory cells comprises a transistor and a capacitor, wherein the transistors of the first and second memory cells share an active area, and wherein gates of the transistors of the first and second memory cells are respectively connected to the first and second word lines.

In some embodiments, the transition control unit generates the first control signal so that electrons accumulated in the transistor of the first memory cell are blocked from moving to one end of the transistor of the second memory cell before the word line voltage of the first word line is transitioned from the first word line voltage to the second word line voltage.

In some embodiments, each of the first and second memory cells comprises a transistor and a capacitor, wherein the transistors of the first and second memory cells are separately formed on active areas spaced apart from each other, and wherein gates of the transistors of the first and second memory cells are respectively connected to the first and second word lines.

In some embodiments, the transition control unit generates the first control signal so that electrons accumulated in an element isolation region separating the first and second memory cells are blocked from moving to one end of the transistor of the second memory cell before the word line voltage of the first word line is transitioned from the first word line voltage to the second word line voltage.

In some embodiments, the memory device is a DRAM device, and gates of transistors of the first and second memory cells comprise recessed gates.

In some embodiments, the memory device is a DRAM device, and each of gates of transistors of the first and second memory cells includes a fin partially contacting a side surface of an active area of a substrate where the transistor is formed, and extending to a field area.

In another aspect of the inventive concepts, a memory device comprises: a memory cell array comprising first and second neighboring word lines, a first memory cell connected to the first word line, and a second memory cell connected to the second word line the second memory cell neighboring positioned adjacent the first memory cell; a word line voltage supplying unit that transitions a word line voltage of the first word line from a first word line voltage to a second word line voltage, in response to a first control signal; and a transition control unit that generates the first control signal, the first control signal controlling the transition period of the word line voltage during a transition period of the word line voltage from the first word line voltage to the second word line voltage so that a transition waveform profile from the first word line voltage to the second word line voltage is different from a transition waveform profile from the second word line voltage to the first word line voltage.

In some embodiments, the transition waveform profile comprises a rate of increase or decrease of the word line voltage.

In some embodiments, the rate of decrease of the word line voltage from the first word line voltage to the second word line voltage is less in absolute value than the rate of increase of the word line voltage from the second word line voltage to the first word line voltage In some embodiments, the transition waveform profile comprises a reduction of the word line voltage from the first word line voltage to the second word line voltage incrementally over a sequence of sub-word-line voltages.

In some embodiments, the transition control unit generates the first control signal so that electrons accumulated in the transistor of the first memory cell are blocked from moving to one end of the transistor of the second memory cell before the word line voltage of the first word line is transitioned from the first word line voltage to the second word line voltage.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF EMBODIMENTS

Figure 1:
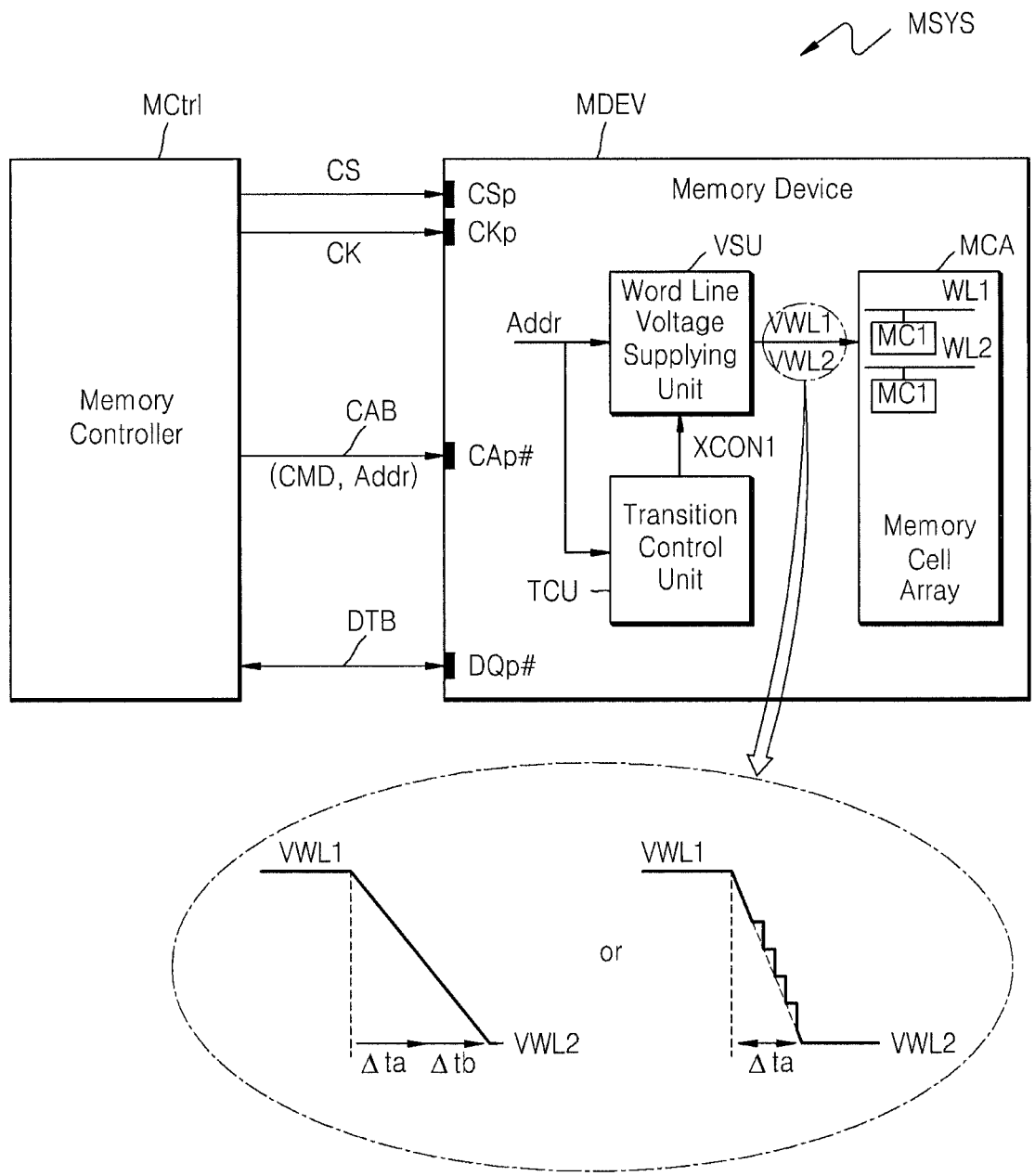
FIG. 1 is a block diagram of a memory system according to an embodiment of the inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this disclosure will be thorough and complete, and will fully convey the scope of the present inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a memory system MSYS according to an embodiment of the inventive concepts. Referring to FIG. 1, the memory system MSYS may include a memory controller MCtrl and a memory device MDEV. The memory controller MCtrl controls memory operations by providing various control signals to the memory device MDEV. For example, the memory controller MCtrl provides a command CMD to the memory device MDEV and thus controls the memory device MDEV to perform an operation corresponding to the command CMD. The command CMD may include various commands related to various memory operations such as read and write. Also, if the memory device MDEV includes a dynamic random access memory (DRAM) device, the command CMD may include commands related to various unique DRAM operations, for example, a refresh command for refreshing a memory cell. For example, the memory controller MCtrl may provide the refresh command to the memory device MDEV as an independent command or automatically together with a write or read command.

The memory controller MCtrl may transmit an address Addr together with the command CMD to the memory device MDEV, and thus may access an area of a memory cell array MCA corresponding to the address Addr. For low power consumption and high-speed operation, the memory device MDEV or the memory system MSYS may include a command/address bus CAB and a command/address pin CAp# for supplying a command and address from the memory controller MCtrl to the memory device MDEV. For example, the memory device MDEV or the memory system MSYS may be a low power double data rate (LPDDR) DRAM device or an LPDDR DRAM system. The command/address bus CAB may be referred to as a CA bus, and the command/address pin CAp# may be referred to as a CA pin.

The memory controller MCtrl transmits the command CMD and the address Addr and transmits an address at rising/falling edges of a clock signal CK, respectively. For example, the address Addr transmitted together with the command CMD at the rising edge of the clock signal CK may include an upper address, for example, a bank address. The clock signal CK may be generated continuously and alternately with an inverted clock signal CKB. Thus, if the command/address bus CAB includes n-bit command/address signals (n is a natural number), 2n-bit command/address signals CA may be provided to the memory device MDEV. Write data WDTA and read data RDTA may be transmitted and received via a DQ bus DTB for connecting the memory controller MCtrl and the memory device MDEV. For example, if the memory device MDEV has a data bit configuration of x32(DQ[31:0]), the number of DQ pins DQp# may be 32. Alternatively, the memory device MDEV has a data bit configuration of x16 (DQ[15:0]), the number of DQ pins DQp# may be 16.

If a logic level of the clock signal CK and an inverted logic level of a chip selection signal CS are respectively supplied in logic high H and logic low L levels as command pins of the memory device MDEV, and a row address strobe signal, a write enable signal, and a column address strobe signal are respectively received as first through third CA pins in arbitrary logic levels, the memory device MDEV may determine that the command CMD is supplied from the memory controller MCtrl, and thus may perform a corresponding operation. For example, if a logic level of the clock signal CK and an inverted logic level of the chip selection signal CS are respectively supplied in logic high H and logic low L levels as command pins, and a row address strobe signal, a write enable signal, and a column address strobe signal are respectively received as the first through third CA pins in logic high H, logic low L, and logic low L levels, the memory device MDEV may determine that a write command is supplied.

Although not shown in FIG. 1, in addition to the above-mentioned commands CMD and the control signals, the memory controller MCtrl may further transmit various control signals such as a data masking signal to the memory device MDEV.

When a command CMD is supplied from the memory controller MCtrl, the memory device MDEV enables an address Addr corresponding to the command CMD, and performs an operation corresponding to the command CMD, for example, write, read, or refresh, on the address Addr. The memory device MDEV includes the memory cell array MCA, a word line voltage supplying unit VSU, and a transition control unit TCU. In a case where the memory device MDEV is a DRAM device, the memory cell array MCA may have a structure illustrated in FIG. 2.

Figure 2:
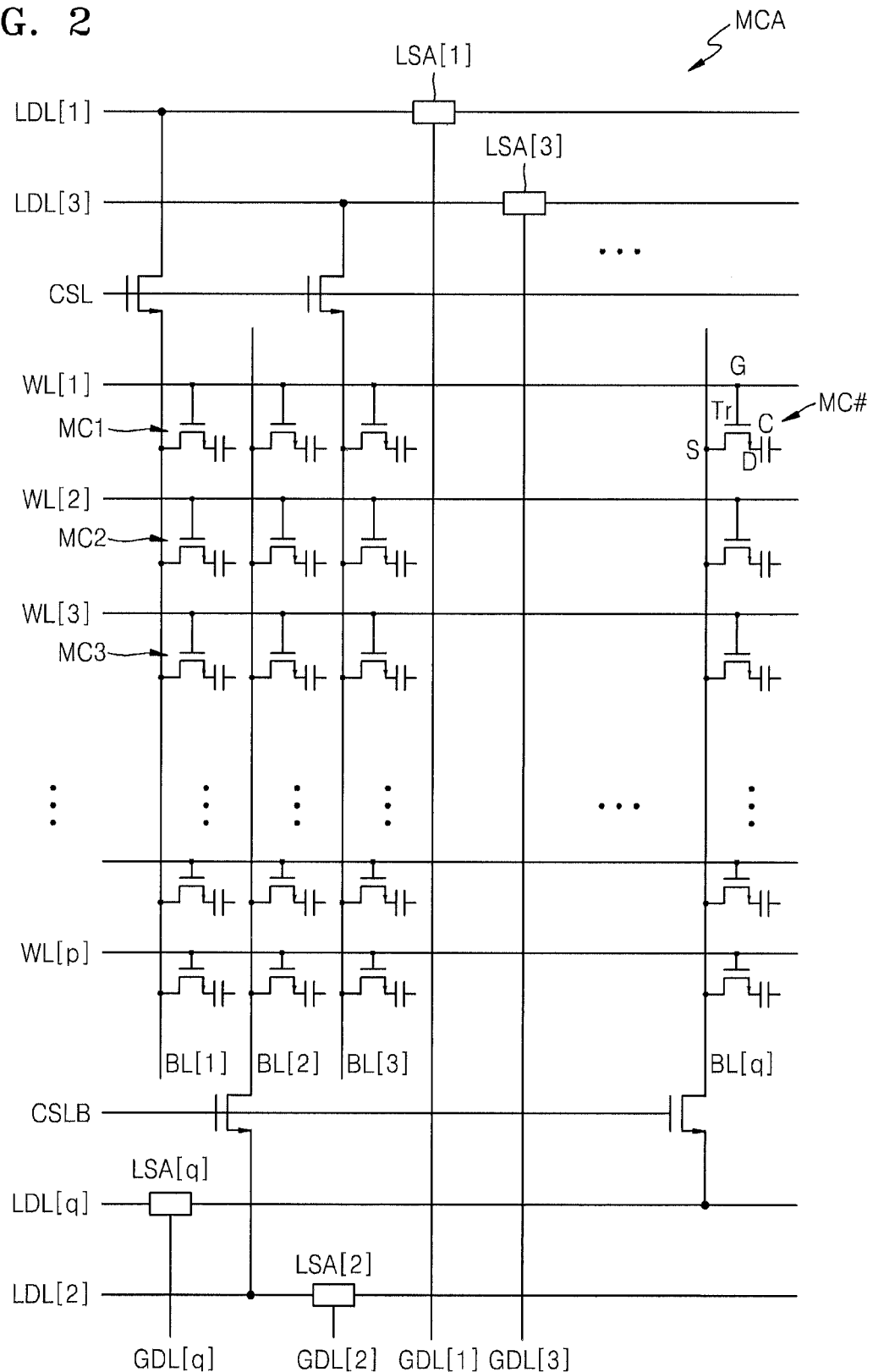
FIG. 2 is a circuit diagram of an example embodiment of a memory cell array illustrated in FIG. 1.

Referring to FIGS. 1 and 2, the memory cell array MCA may include a plurality of memory cells MC# connected to first through pth word lines WL1, WL2, . . . , WLp and first through qth bit lines BL1, BL2, . . . , BLq. Each of the memory cells MC# may include a transistor Tr and a capacitor C. The transistor Tr controls an on or off state of the corresponding memory cell MC#. The capacitor C is charged with an amount of charge corresponding to a data value written in the corresponding memory cell MC#. A source S of each transistor Tr is connected to a bit line BL#, a drain D of the transistor Tr is connected to one end of the capacitor C, and a gate G of the transistor Tr is connected to a word line WL#.

The address Addr provided from the memory controller MCtrl is decoded to a row address and a column address by a decoder (not shown) of the memory device MDEV. From among the first through pth word lines WL1, WL2, . . . , WLp of the memory cell array MCA, one corresponding to the row address, is enabled. The word line corresponding to the row address may be enabled by supplying a first voltage, for example, a selected word line voltage (e.g., 3V), to the word line. On the other hand, word lines other than the word line corresponding to the row address may be disabled by supplying a second voltage, for example, a non-selected word line voltage (e.g., −0.4V), to other word lines. From among the first through qth bit lines BL1, BL2, . . . , BLq of the memory cell array MCA, one corresponding to the column address is enabled.

An operation such as write or read may be performed on a memory cell connected to the enabled word line and the bit line. For example, if the first word line WL1 and the first bit line BL1 are enabled, the transistor Tr of a first memory cell MC1 may be turned on and thus a voltage corresponding to a data value stored in the capacitor C of the first memory cell MC1 may be transmitted to first through qth local data lines LDL1, LDL2, LDL3, . . . , LDLq due to a column selection operation via column selection lines CSL and CSLB, may be amplified by first through qth local sense amplifiers LSA1, LSA2, LSA3, . . . , LSAq, and thus may be transmitted to first through qth global data lines GDL1, GDL2, GDL3, . . . , GDLq, thereby performing a read operation.

Figure 3:
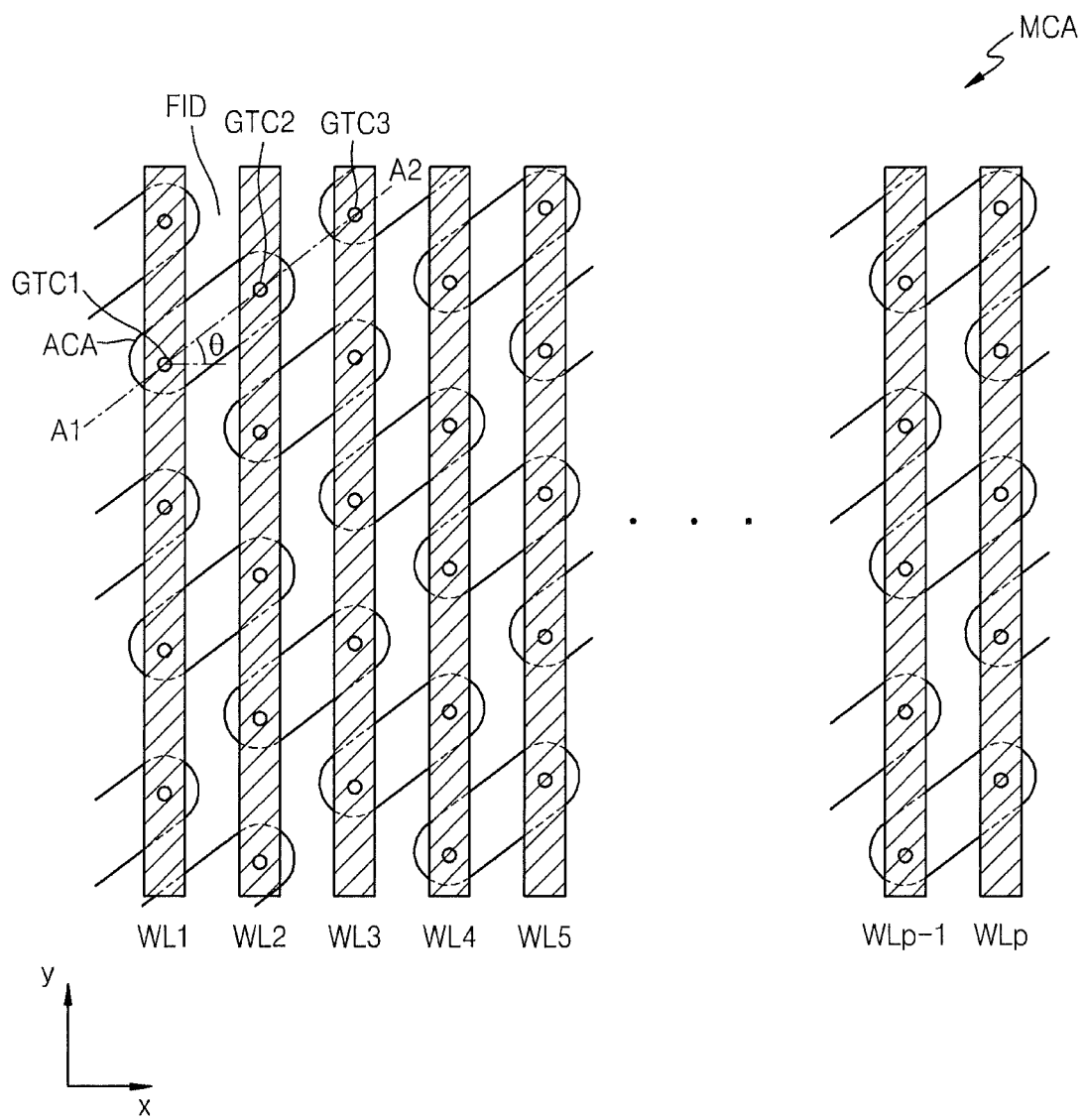
FIGS. 3 and 4 are magnified diagrams of a portion of the memory cell array illustrated in FIG. 2.
Figure 4:
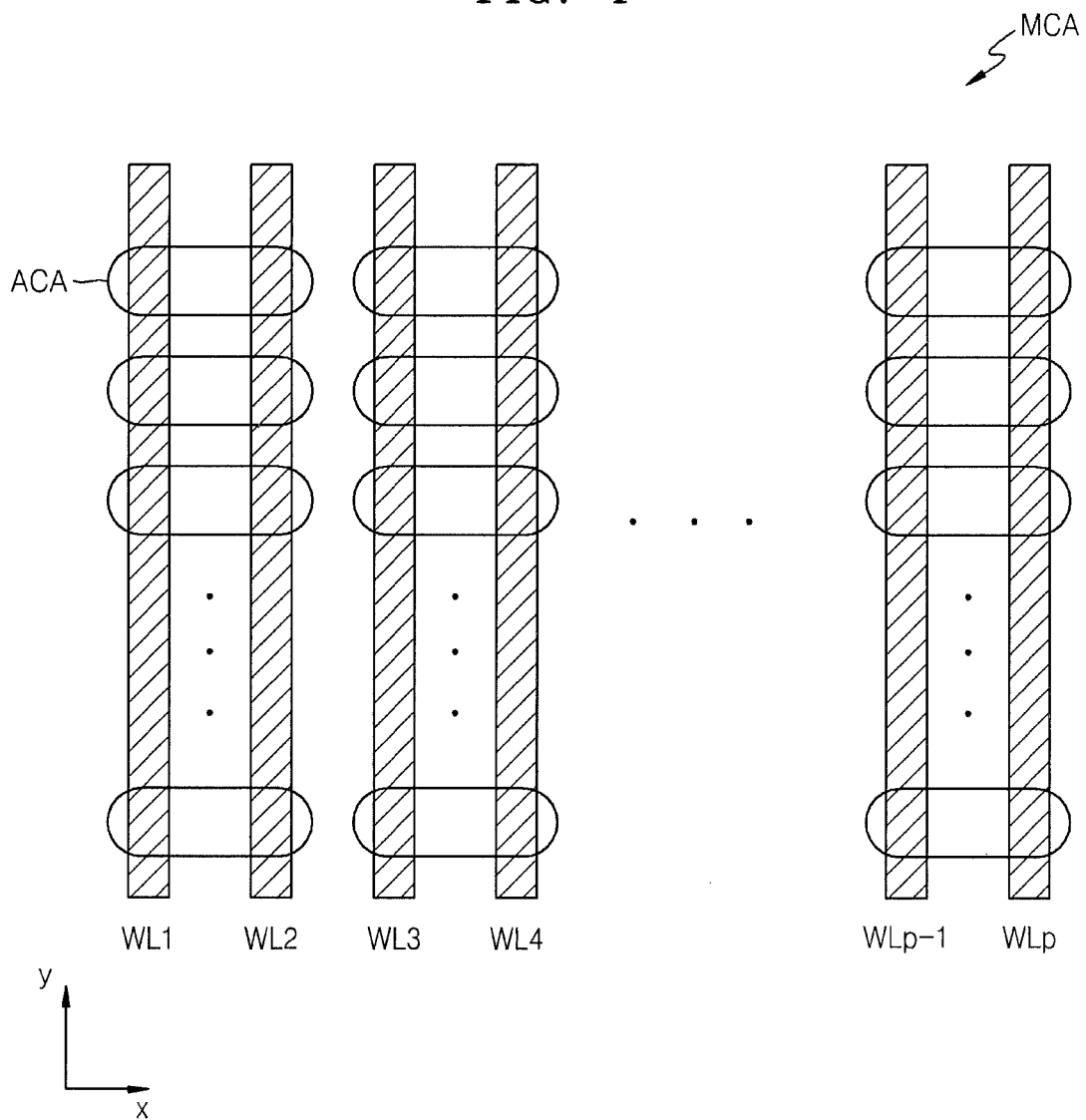

FIGS. 3 and 4 are magnified diagrams of a portion of the memory cell array MCA illustrated in FIG. 2. Referring to FIGS. 2 and 3, from among the memory cells MC# of the memory cell array MCA, first and second memory cells MC1 and MC2 may be located adjacent to each other, and may be respectively connected to the first and second word lines WL1 and WL2 located adjacent to each other. For example, the gates G of the transistors Tr of the first and second memory cells MC1 and MC2 may be respectively connected via first and second gate contacts GTC1 and GTC2 to the first and second word lines WL1 and WL2. Thus, the first and second memory cells MC1 and MC2 may be respectively turned on or off according to voltages supplied to the first and second word lines WL1 and WL2.

The transistors Tr of the first and second memory cells MC1 and MC2 may be formed on one active area ACA. The active area ACA may be formed in a long island shape having major and minor axes. The active area ACA may be tilted at an arbitrary angle θ with respect to a direction in which the first through pth word lines WL1, WL2, . . . , WLp are formed or otherwise extend (y direction), for example, an angle θ greater than 0° and less than 90°. The angle θ of the active area ACA may be differently set according to, for example, a cell pitch representing a distance between memory cells, and a doping density of the active area ACA.

Although described in this manner, embodiments of the present inventive concepts are not limited thereto. Referring to FIG. 4, the active area ACA may be formed in a long island shape having major and minor axes in a direction perpendicular to the direction in which the first through pth word lines WL1, WL2, WLp are formed (y direction). Unlike FIG. 3, in FIG. 4, the active area ACA is shared by memory cells connected to a word line pair, for example, the first and second word lines WL1 and WL2, or the third and fourth word lines WL3 and WL4. Thus, memory cells connected to the second and third word lines WL2 and WL3 are formed on the active areas ACA spaced apart from each other.

In FIG. 3, for example, an arbitrary memory cell connected to the second word line WL2 may share the active area ACA with an arbitrary memory cell of the first word line WL1, and another memory cell connected to the second word line WL2 may share the active area ACA with an arbitrary memory cell of the third word line WL3. Thus, an arbitrary memory cell connected to the second word line WL2 (e.g., the second memory cell MC2) and an arbitrary memory cell connected to the first word line WL1 (e.g., the first memory cell MC1) may be formed on one active area ACA, and another memory cell connected to the second word line WL2 (e.g., a memory cell MC22) and another memory cell connected to the first word line WL1 (e.g., a memory cell MC12) may be formed on another active area.

Figure 5:
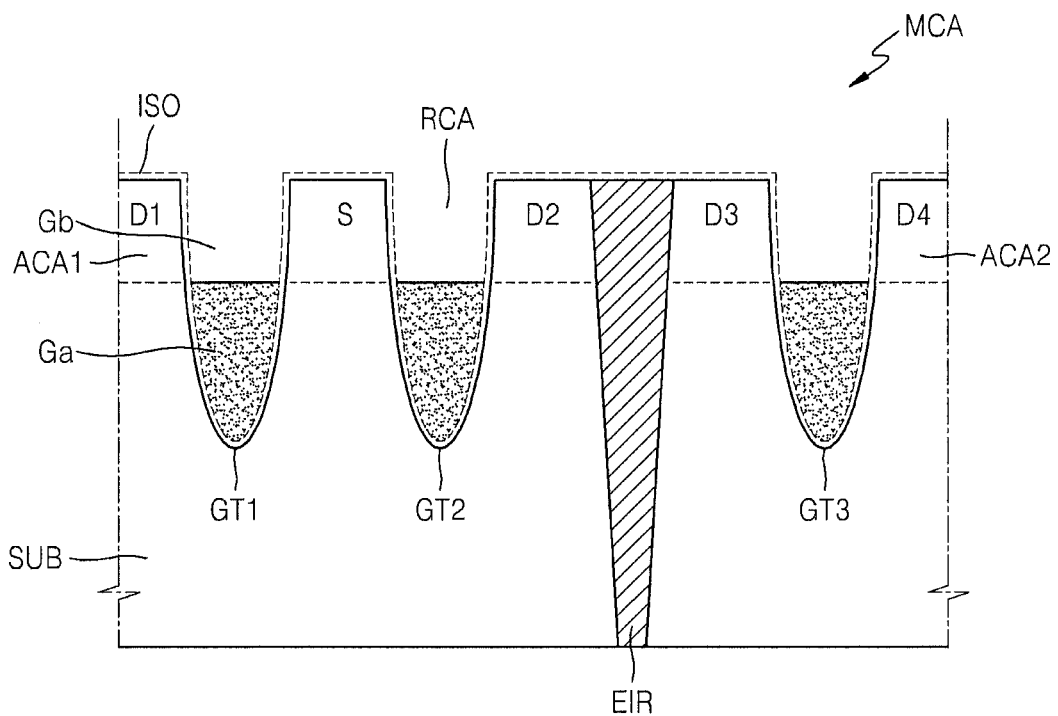
FIG. 5 is a cross-sectional diagram cut along a dashed line A1-A2 of FIG. 3.

FIG. 5 is a cross-sectional diagram cut along a dashed line A1-A2 of FIG. 3. Referring to FIGS. 2, 3, and 5, first through third memory cells MC1, MC2, and MC3 respectively connected to the first through third word lines WL1, WL2, and WL3 may be formed on a plurality of active areas ACA on a substrate SUB. In some embodiments, the substrate SUB may include, for example, crystalline, polycrystalline, or amorphous silicon (Si) materials. In some embodiments, the substrate SUB may include a compound semiconductor, for example, germanium (Ge), silicon germanium (SiGe), silicon carbide (SiC), gallium arsenide (GaAs), indium arsenide (InAs), or indium phosphide (InP). Alternatively, in some embodiments, the substrate SUB may include a silicon on insulator (SOI) structure or a buried oxide layer (BOX). The substrate SUB may include a conductive area, for example, an impurity-doped well or an impurity-doped structure.

First and second active areas ACA1 and ACA2 may be defined by an element isolation region EIR as connection target areas on the substrate SUB. The element isolation region EIR may be formed by forming a trench in the substrate SUB, and then filling the trench with oxide, nitride, or silicon oxynitride. A plurality of recess areas RCA are formed in the substrate SUB. A plurality of gate dielectric layers ISO, a plurality of buried gate lines Ga, and a plurality of buried insulating layers Gb may be sequentially formed in the recess areas RCA. Each buried gate line Ga and each buried insulating layer Gb together may be referred to as a gate or a recess gate. Top surfaces of the buried gate lines Ga may be formed in a level lower than the level of top surfaces of the active areas ACA. After the resultant structure in which the recess areas RCA are formed is cleaned, the gate dielectric layers ISO, the buried gate lines Ga, and the buried insulating layers Gb are sequentially formed in the recess areas RCA. In some embodiments, after the buried gate lines Ga are formed, source and drain areas (not shown) may be formed in the top surfaces of the active areas ACA by injecting impurity ions into the active areas ACA from two sides of the buried gate lines Ga. In some other embodiments, the impurity ion injection process for forming the source and drain areas may be performed before the buried gate lines Ga are formed.

Figure 6:
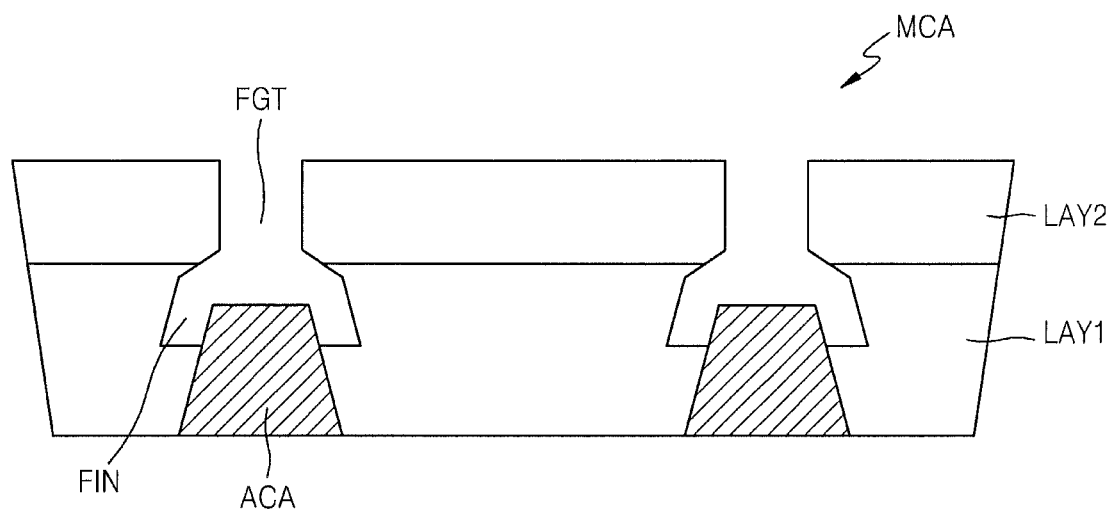
FIG. 6 is a cross-sectional diagram of an example of a memory cell illustrated in FIG. 2.

In some embodiments, the top surface of each of the buried gate lines Ga may be in a level lower than the level of the top surfaces of the active areas ACA. In some embodiments, the buried gate lines Ga may be formed of at least one material selected from the group consisting of for example, titanium (Ti), titanium nitride (TiN), tantalum (Ta), tantalum nitride (TaN), tungsten (W), tungsten nitride (WN), titanium silicon nitride (TiSiN), and tungsten silicon nitride (WSiN). Bottom surfaces of the buried gate lines Ga may have an uneven shape, and saddle fin field effect transistors (TFTs) FGT may be formed on the active areas ACA as illustrated in FIG. 6. Referring to FIG. 6, in some embodiments, the saddle fin TFT FGT may include a fin FIN partially contacting a side surface of the active area ACA and extending toward a field area (first and second isolation layers LAY1 and LAY2). The fin FIN of the saddle fin TFT FGT may be formed to partially surround the side surface of the active area ACA by primarily etching the first and second isolation layers LAY1 and LAY2 so as to form a recess gate, and then selectively secondarily etching the first and second isolation layers LAY1 and LAY2. The first and second isolation layers LAY1 and LAY2 may be formed as oxide layers, and the first isolation layer LAY1 may have an etching speed faster than the etching speed of the second isolation layer LAY2.

Referring back to FIG. 5, in some embodiments, the gate dielectric layers ISO may be formed of at least one selected from the group consisting of silicon oxide, silicon nitride, silicon oxynitride, oxide/nitride/oxide (ONO), and a high-k dielectric material having a dielectric constant higher than the dielectric constant of silicon oxide. For example, in some embodiments, the gate dielectric layers ISO may have a dielectric constant of about 10 to 25. In some embodiments, the gate dielectric layers ISO may be formed of at least one material selected from the group consisting of, for example, hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, in some embodiments, the gate dielectric layers ISO may be formed of $HfO_2$, $Al_2O_3$, $HfAlO_3$, $Ta_2O_3$, or $TiO_2$.

In some embodiments, top surfaces of the buried insulating layers Gb may be in a level almost the same as the level of top surfaces of the first and second active areas ACA1 and ACA2. In some embodiments, the buried insulating layers Gb may be formed of silicon oxide, silicon nitride, silicon oxynitride, or a combination thereof.

As described above, the first and second memory cells MC1 and MC2 respectively connected to the first and second word lines WL1 and WL2 may be formed on the same first active area ACA1. A source S may be connected to a bit line, and a drain D may be connected to one end of the capacitor C. First through third gates GT1, GT2, and GT3 are connected to the first through third word lines WL1, WL2, and WL3 via gate contact. On the other hand, the second and third memory cells MC2 and MC3 respectively connected to the second and third word lines WL2 and WL3 may be respectively formed on the first and second active areas ACA1 and ACA2 spaced from each other. The first and second active areas ACA1 and ACA2 may be separated by the above-described element isolation region EIR. The memory cell array MCA of FIG. 2 or 3 may be formed by repeatedly forming or partially modifying the cross-sectional structure of FIG. 5.

Referring back to FIG. 1, the word line voltage supplying unit VSU receives the decoded address information Addr, and enables a word line corresponding to a row address indicated by the address information Addr. As described above, the word line having the row address may be enabled by supplying a first word line voltage VWL1, for example, a selected word line voltage, to the word line. In this case, word lines other than the enabled word line may be disabled. As described above, the word lines other than the enabled word line may be disabled by supplying a second word line voltage VWL2, for example, a non-selected word line voltage, to other word lines.

However, in a case where a voltage supplied to adjacent word lines is repeatedly toggled between the first and second word line voltages VWL1 and VWL2, the amount of charge stored in a capacitor of a memory cell connected to the word lines may be changed. Likewise, a drain voltage of a drain of a transistor connected to one end of the capacitor of the memory cell can be varied. For example, electrons accumulated in a gate of a transistor of a memory cell connected to adjacent word lines may move to a drain terminal of the memory cell, and thus the charge of a capacitor connected to the drain terminal may be lost. Alternatively, holes accumulated in a gate of a transistor of a memory cell connected to adjacent word lines may move to a drain terminal of the memory cell, and thus the amount of charge stored in a capacitor connected to the drain terminal may be increased.

Figure 7:
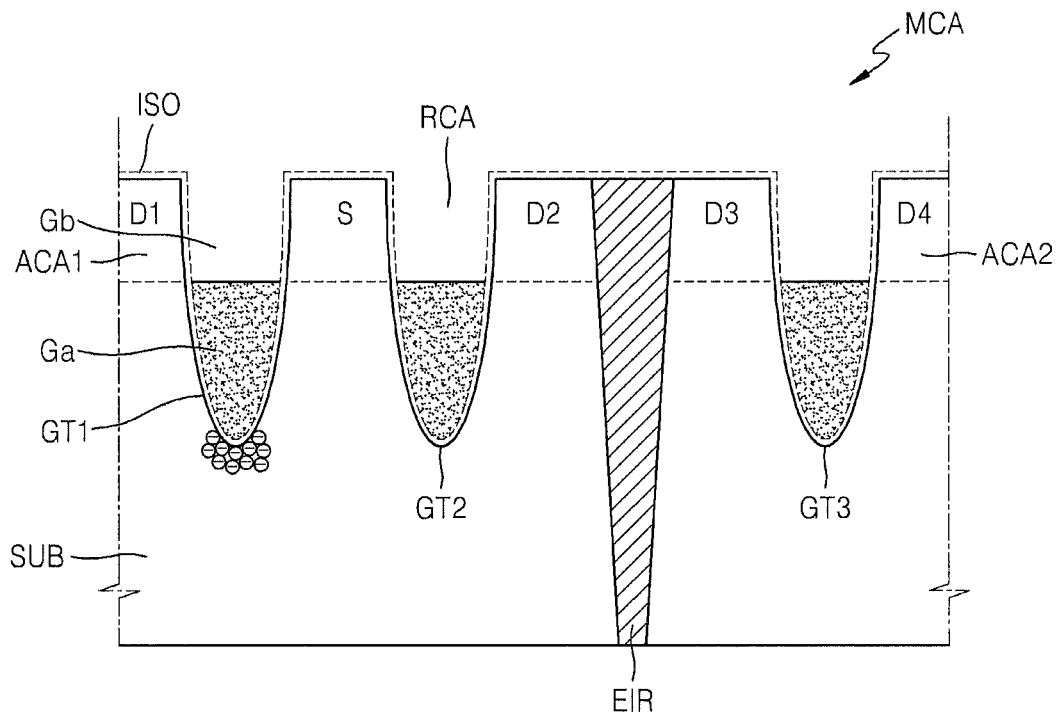
FIGS. 7, 8, 9A and 9B are cross-sectional diagrams for describing the 1-row disturbance phenomenon.
Figure 8:
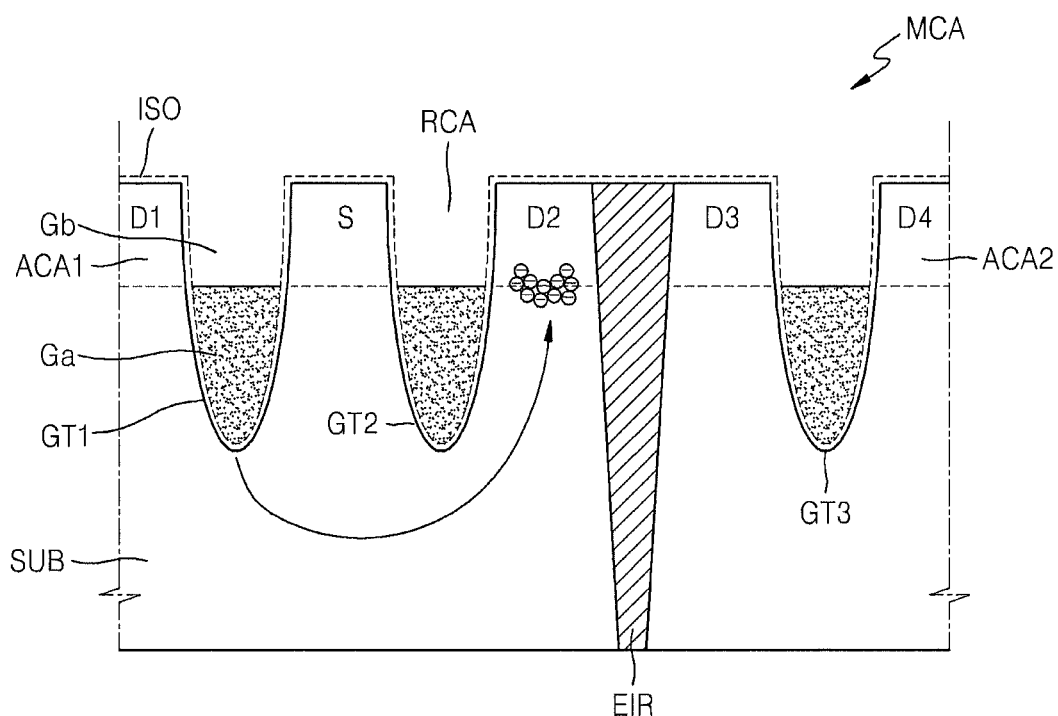

For example, referring to FIGS. 1, 2, and 7, assuming the word line voltage applied to the first word line WL1 is the selected word line voltage VWL1, charge may be accumulated in a gate GT1 of the transistor Tr of the first memory cell MC1 connected to the first word line WL1. In the state of FIG. 7, if the word line voltage of the first word line WL1 is transitioned from the selected word line voltage VWL1 to the non-selected word line voltage VWL2, as illustrated in FIG. 8, the charge accumulated in the gate GT1 of the transistor Tr of the first memory cell MC1 may not move to the source S but instead may move to a drain D2 of the second memory cell MC2 located adjacent to the first memory cell MC1.

For example, if a charge amount corresponding to a data 1 value is charged in the capacitor C connected to the drain D2 of the second memory cell MC2, due to the drain-induced barrier lowering (DIBL) phenomenon, a potential barrier of a gate GT2 of the transistor Tr of the second memory cell MC2 that shares the active area ACA with the first memory cell MC1 may be reduced. The DIBL phenomenon may become more pronounced as the design rule of the device is reduced. Thus, if a voltage of the gate GT1 of the transistor Tr of the first memory cell MC1 is reduced from the selected word line voltage VWL1 to the non-selected word line voltage VWL2 and thus a potential barrier of the gate GT1 of the transistor Tr of the first memory cell MC1 is increased, electrons accumulated in the gate GT1 of the transistor Tr of the first memory cell MC1 may move through the potential barrier of the gate GT2 of the transistor Tr of the second memory cell MC2 to the drain D2 of the transistor Tr of the second memory cell MC2.

That is, the flow of charge may be generated from the gate GT1 of the transistor Tr of the first memory cell MC1 to the drain D2 of the transistor Tr of the second memory cell MC2, a drain voltage of the drain D2 of the transistor Tr of the second memory cell MC2 may be reduced due to the movement of electrons, and thus charges of the capacitor C connected to the drain D2 of the transistor Tr of the second memory cell MC2 may be lost. Due to the loss of the charge of the capacitor C of the second memory cell MC2, an error can occur such that a data value of 1 stored in the second memory cell MC2 can be sensed as data 0 instead of data 1.

Figure 9A:
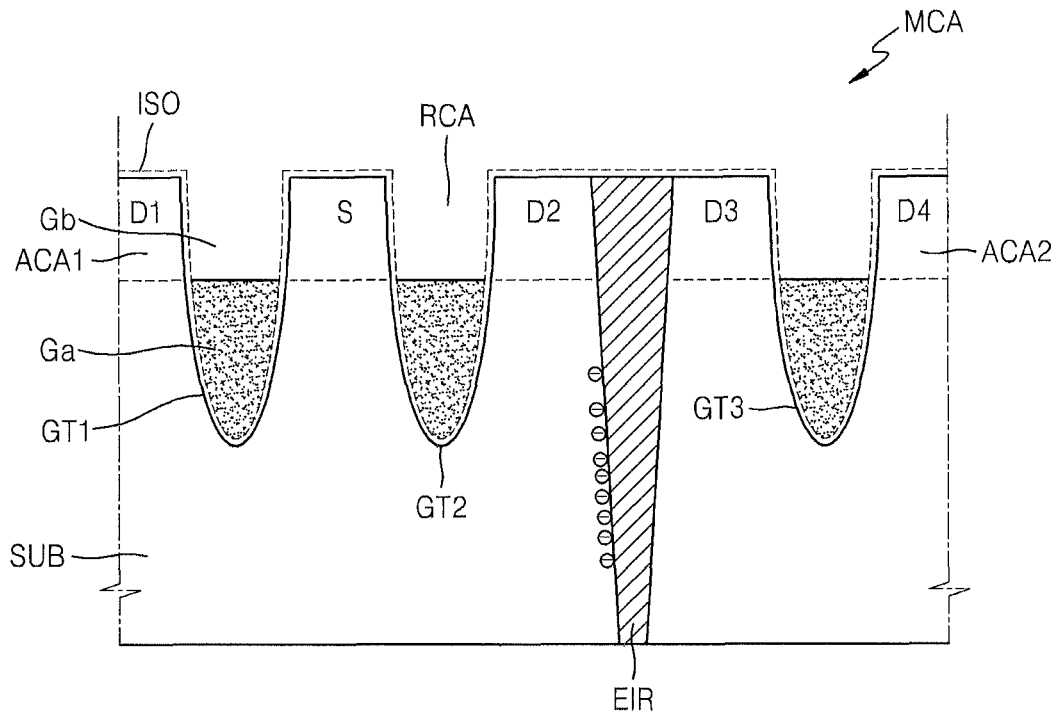
Figure 9B:
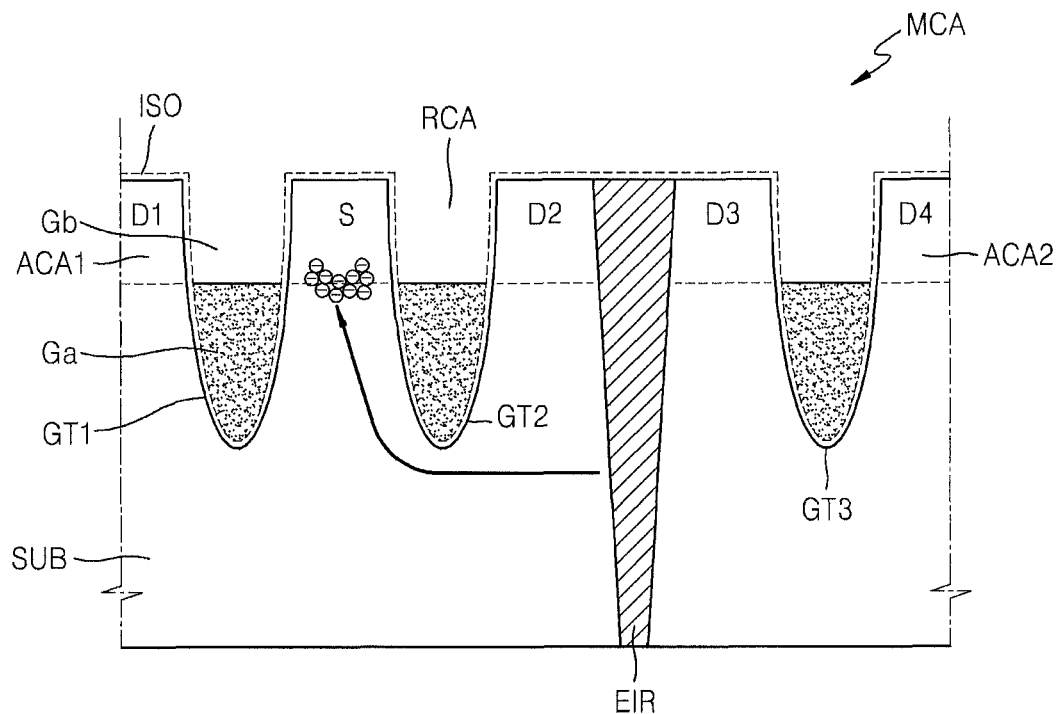

Also, referring to FIGS. 1, 2, and 9A, during a time when a word line voltage of the third word line WL3 is the selected word line voltage VWL1 and a word line voltage of the first and second word lines WL1 and WL2 is the non-selected word line voltage VWL2, electrons of the drain D2 of the second memory cell MC2 separated by the element isolation region EIR from the third memory cell MC3 connected to the third word line WL3 may be accumulated at the sidewall of the element isolation region EIR. In the state of FIG. 9A, if the word line voltage of the third word line WL3 is transitioned from the selected word line voltage VWL1 to the non-selected word line voltage VWL2, as illustrated in FIG. 9B, the electrons accumulated in the element isolation region EIR may not move to the drain D2 of the second memory cell MC2 but may instead move to the source S shared by the first and second memory cells MC1 and MC2.

In this case, due to lack of electrons on the drain D2 of the second memory cell MC2, if charge corresponding to data value 0 are charged in the second memory cell MC2, the drain voltage of the drain D2 of the transistor Tr of the second memory cell MC2 may be changed. As such, an error can occur such that a data value of 0 stored in the second memory cell MC2 can be sensed as data 1 instead of data 0. As described above, the second memory cell MC2 may be formed on the first active area ACA1 while the third memory cell MC3 may be formed on the second active area ACA2.

The 1-row disturbance phenomenon that a capacitance of a capacitor of a memory cell is misread due to toggling of a word line voltage between adjacent word lines may influence the reliability of a memory device and a memory system including the memory device. However, according to an embodiment of the inventive concepts, a variation in drain voltage due to toggling of a word line voltage supplied to adjacent word lines may be prevented, and thus the reliability of the memory device MDEV or the memory system MSYS may be improved. A detailed description thereof will now be provided.

Referring back to FIGS. 1 and 2, the word line voltage supplying unit VSU supplies the first word line voltage VWL1 to an arbitrary word line and supplies the second word line voltage VWL2 to other word lines in response to the address information Addr. For example, the first word line voltage VWL1 may be a selected word line voltage (e.g., 3V), and the second word line voltage VWL2 may be a non-selected word line voltage (e.g., −0.4V). For example, if the address information Addr indicates the first word line WL1, the word line voltage supplying unit VSU may supply 3V to the first word line WL1 and may supply −0.4V to other word lines.

If the address information Addr is changed, the word line voltage supplying unit VSU may transition a word line voltage supplied to each word line. For example, if the address information Addr indicating the first word line WL1 is changed to indicate the sixth word line WL6, the word line voltage supplying unit VSU transitions the word line voltage of the first word line WL1 from the selected word line voltage VWL1 to the non-selected word line voltage VWL2. In addition, the word line voltage supplying unit VSU transitions the word line voltage of the sixth word line WL6 from the non-selected word line voltage VWL2 to the selected word line voltage VWL1.

The word line voltage supplying unit VSU may transition the word line voltage from the first word line voltage VWL1 to the second word line voltage VWL2 in response to a first control signal XCON1. For example, when the first word line voltage VWL1 is transitioned to the second word line voltage VWL2, the word line voltage supplying unit VSU may change a disable time of the first word line voltage VWL1 in response to the first control signal XCON1. For example, the first word line voltage VWL1 may be transitioned to the second word line voltage VWL2 in a time period Δtb that is delayed in comparison to a time period Δta. Alternatively, when the first word line voltage VWL1 is transitioned to the second word line voltage VWL2, the word line voltage supplying unit VSU may change the shape of a voltage pulse of the first word line voltage VWL1 in response to the first control signal XCON1. For example, the shape of the first word line voltage VWL1 transitioned to the second word line voltage VWL2 without being delayed, that is, within the time period Δta, may be a stair shape reduced sequentially to n sub word line voltages. The first control signal XCON1 may be transmitted from the transition control unit TCU.

In order to prevent the above-described voltage variation of a drain terminal due to toggling of a word line voltage supplied to adjacent word lines, the transition control unit TCU may generate the first control signal XCON1 in such a way that the voltage profile of the transition from the first word line voltage VWL1 to the second word line voltage VWL2 is different from the voltage profile of the transition from the second word line voltage VWL2 to the first word line voltage VWL1. As described above, in some example embodiments, the first word line voltage VWL1 may be a selected word line voltage and the second word line voltage VWL2 may be a non-selected word line voltage.

Figure 10:
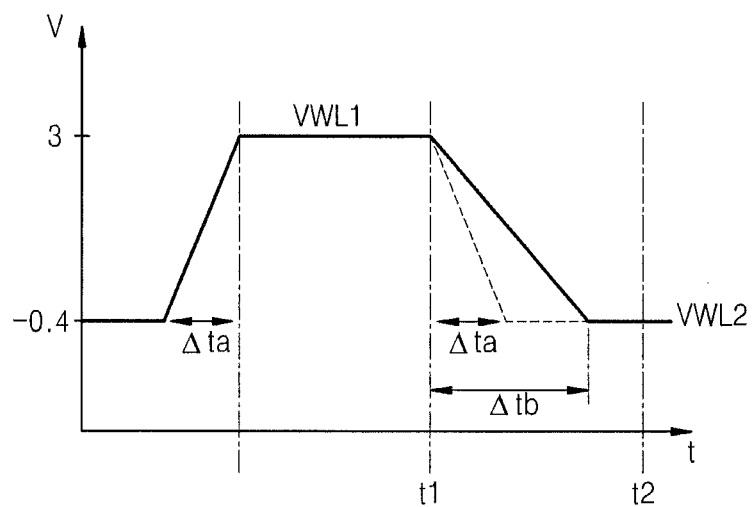
FIGS. 10 and 11 are diagrams for describing an example of operation of a memory device illustrated in FIG. 1.
Figure 11:
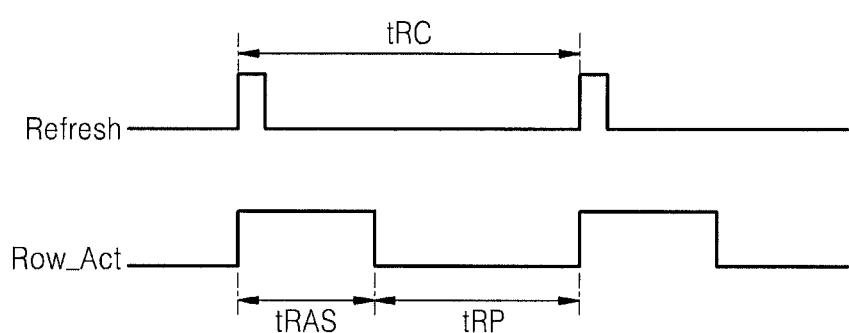

For example, in order to prevent a voltage variation of a drain terminal of adjacent memory cells when a word line voltage supplied to adjacent word lines is toggled from a selected word line voltage to a non-selected word line voltage, as illustrated in FIG. 10, the transition control unit TCU may generate the first control signal XCON1 according to a transition waveform profile in such a way that the time period Δtb taken to transition the first word line voltage VWL1 to the second word line voltage VWL2 is longer than the time period Δta taken to transition the second word line voltage VWL2 to the first word line voltage VWL1 (Δtb>Δta). It can also be said that the rate of decrease of the word line voltage from the first word line voltage to the second word line voltage is less in absolute value than the rate of increase of the word line voltage from the second word line voltage to the first word line voltage As described above, in a case where the memory device MDEV is a DRAM device, the time period Δtb taken to transition the first word line voltage VWL1 to the second word line voltage VWL2 may be set to correspond to a row cycle time tRC set with respect to the memory device MDEV. Referring to FIG. 11, the row cycle time tRC is a sum of a row active time tRAS and a row pre-charge time tRP. The row active time tRAS is a maximum value for enabling pre-charge, and indicates a clock cycle between a bank active command and a pre-charge command. The row pre-charge time tRP is a time required to disable a row and to recharge a bit line value, and is a time period taken until a pre-charge command on a row is disabled and a row address strobe signal RAS on other rows is enabled.

A time period taken to perform an arbitrary operation on each row, for example, a write operation, a read operation, or a refresh operation on memory cells connected to each row, may be controlled by restricting a row cycle time, a row active time, or a row pre-charge time. An operation time on each row may also be controlled by differently setting a row cycle time, a row active time, or a row pre-charge time. If a row cycle time, a row active time, or a row pre-charge time is increased, an operation time of the memory device MDEV or the memory system MSYS may be increased.

Figure 12:
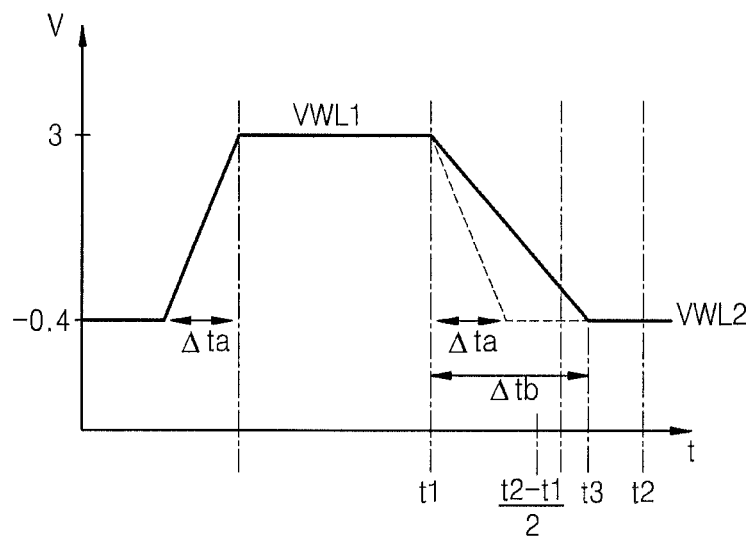
FIG. 12 is a graph for describing another example of operation of the memory device illustrated in FIG. 1.

In order to prevent a voltage variation of a drain terminal due to toggling of a word line voltage supplied to adjacent word lines, and in order to avoid increasing an operation time of the memory device MDEV or the memory system MSYS, as illustrated in FIG. 12, the transition control unit TCU of the memory device MDEV and the memory system MSYS may generate the first control signal XCON1 in such a way that a voltage level of the first word line WL1 corresponds to the voltage level of the second word line voltage VWL2 at least between a ½ time point from a first time point t1 for starting to transition the first word line voltage VWL1 to the second word line voltage VWL2, to a second time point t2 for ending the row pre-charge time tRP of the first word line WL1, and the second time point t2 for ending the row pre-charge time tRP of the first word line WL1.

Figure 13:
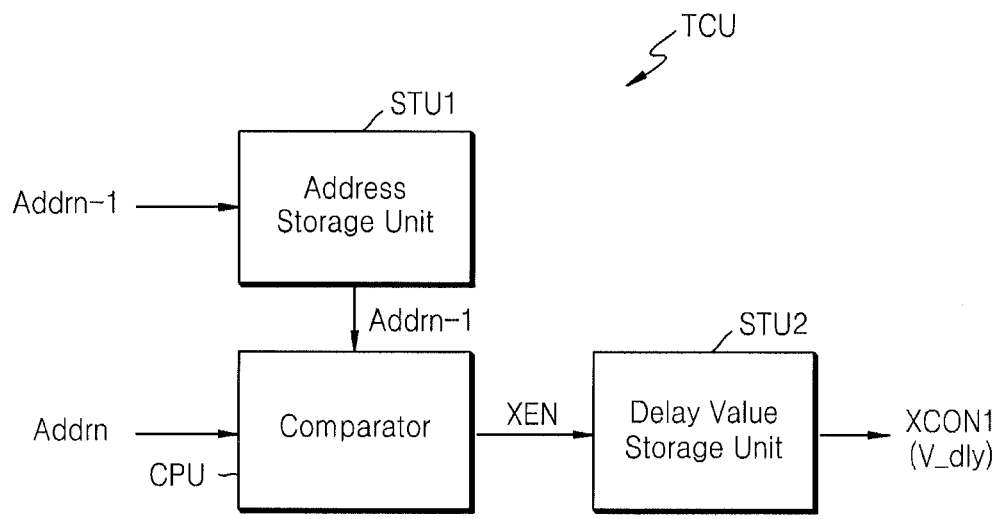
FIG. 13 is a block diagram of an example of a transition control unit illustrated in FIG. 1.

FIG. 13 is a block diagram of an example embodiment of the transition control unit TCU illustrated in FIG. 1. Referring to FIGS. 1 and 13, the transition control unit TCU may include an address storage unit STU1, a comparator CPU, and a delay value storage unit STU2. The address storage unit STU1 stores a previous address Addrn−1. The previous address Addrn−1 refers to an address where a previous command is executed until a clock immediately before a current command is enabled. If a current address Addrn is received, the comparator CPU compares the previous address Addrn−1 stored in the address storage unit STU1, to the current address Addrn. If the previous address Addrn−1 and the current address Addrn are different, that is, if a word line voltage of a word line corresponding to the previous address Addrn−1 should be transitioned from the first word line voltage VWL1 to the second word line voltage VWL2, the comparator CPU generates an enable signal XEN. The delay value storage unit STU2 may output the first control signal XCON1 including a delay value V-dly of a time period for transitioning a word line voltage of a word line corresponding to the previous address Addrn−1 from the first word line voltage VWL1 to the second word line voltage VWL2, in response to the enable signal XEN.

For example, as illustrated in FIG. 10, the delay value V-dly may be a value of a time period that represents an additional delay amount relative to the time period Δta for transitioning the second word line voltage VWL2 to the first word line voltage VWL1, by an arbitrary time period (Δtb−Δta). As described above, when a gate voltage of the first gate GT1 of FIG. 5 is transitioned from the first word line voltage VWL1 to the second word line voltage VWL2, the delay value V-dly may be set in such a way that electrons accumulated in the first gate GT1 do not move to the drain D2 of the second memory cell MC2 and sufficiently react in the source S. Alternatively, when a gate voltage of the third gate GT3 of FIG. 9 is transitioned from the first word line voltage VWL1 to the second word line voltage VWL2, the delay value V-dly may be set in such a way that electrons accumulated in the element isolation region EIR between the second and third memory cells MC2 and MC3 do not move to the source S of the second memory cell MC2 and sufficiently react in the drain D2 of the second memory cell MC2.

For example, as described above in relation to FIG. 12, the delay value V-dly may be set in such a way that a voltage level of the first word line WL1 corresponds to the voltage level of the second word line voltage VWL2 between a ½ time point from the first time point t1 for starting to transition the first word line voltage VWL1 to the second word line voltage VWL2, to the second time point t2 for ending the row pre-charge time tRP of the first word line WL1, and the second time point t2 for ending the row pre-charge time tRP of the first word line WL1.

Figure 14:
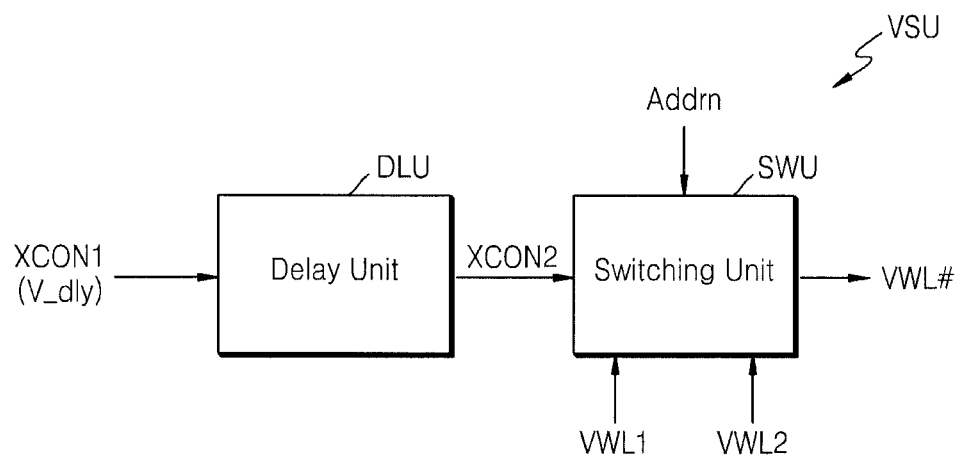
FIG. 14 is a block diagram of an example of a word line voltage supplying unit illustrated in FIG. 1.

FIG. 14 is a block diagram of an example of the word line voltage supplying unit VSU illustrated in FIG. 1. Referring to FIGS. 1 and 14, the word line voltage supplying unit VSU may include a delay unit DLU and a switching unit SWU. The delay unit DLU outputs a delay control signal XCON2 in response to the first control signal XCON1. The delay control signal XCON2 may be a signal corresponding to the delay value V-dly of the first control signal XCON1, and for adjusting a time when the switching unit SWU supplies a word line voltage, e.g., the first word line voltage VWL1, to a word line, e.g., the first word line WL1. For example, the switching unit SWU may switch a word line voltage supplied to a word line corresponding to the current address Addrn, to one of the first and second word line voltages VWL1 and VWL2. The switching unit SWU may be implemented as a transistor (not shown), and may include an RC delay circuit (not shown) for performing a delay according to the delay control signal XCON2.

The current embodiment of the VSU is not limited to the embodiments described herein. In other example embodiments, the word line voltage supplying unit VSU may delay an output of the switching unit SWU via the delay unit DLU. Alternatively, the word line voltage supplying unit VSU of FIG. 14 may directly supply the first control signal XCON1 to the switching unit SWU, and may delay a disable time of the first word line voltage VWL1. Alternatively, the transition control unit TCU of FIG. 13 may generate only a comparison result of the previous address Addrn−1 and the current address Addrn as the first control signal XCON1, and the delay unit DLU of the word line voltage supplying unit VSU of FIG. 14 may set a delay value of FIG. 10 or FIG. 12 in response to the first control signal XCON1.

Systems and methods of preventing a voltage variation of a drain terminal of adjacent memory cells when a word line voltage supplied to adjacent word lines is transitioned from a selected word line voltage to a non-selected word line voltage, by delaying a time period taken to transition the first word line voltage VWL1 to the second word line voltage VWL2 have been described herein thus far. Alternatively, according to the memory device MDEV and the memory system MSYS, a voltage variation of a drain terminal of adjacent memory cells when a word line voltage supplied to adjacent word lines is transitioned from a selected word line voltage to a non-selected word line voltage may be prevented by changing a waveform of the first word line voltage VWL1 in a time period for transitioning the first word line voltage VWL1 to the second word line voltage VWL2.

Figure 15:
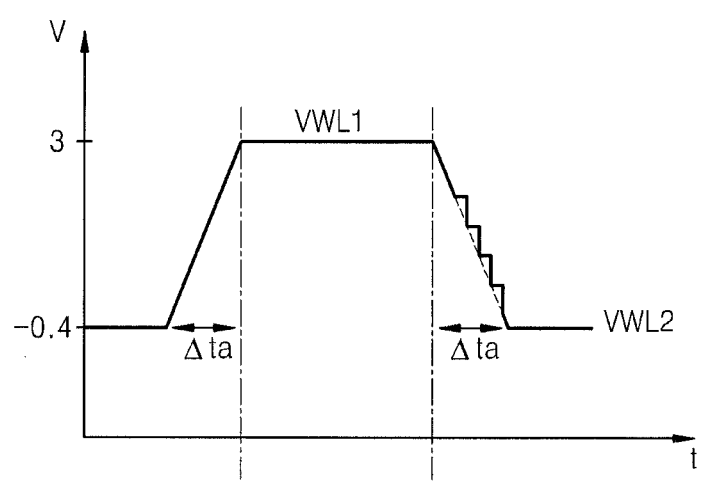
FIG. 15 is a graph showing another control operation of the transition control unit illustrated in FIG. 1.

FIG. 15 is a graph showing another control operation of the transition control unit TCU illustrated in FIG. 1. Referring to FIGS. 1 and 15, in order to prevent a voltage variation of a drain terminal of adjacent memory cells when a word line voltage supplied to adjacent word lines is transitioned from a selected word line voltage to a non-selected word line voltage, the transition control unit TCU may change the shape of a pulse, or change the waveform, of the first word line voltage VWL1 in a time period for transitioning the first word line voltage VWL1 to the second word line voltage VWL2. For example, the transition control unit TCU may generate the first control signal XCON1 in such a way that the first word line voltage VWL1 is reduced sequentially, or incrementally, to n sub word line voltages (n is a positive integer) and thus is transitioned to the second word line voltage VWL2.

Figure 16:
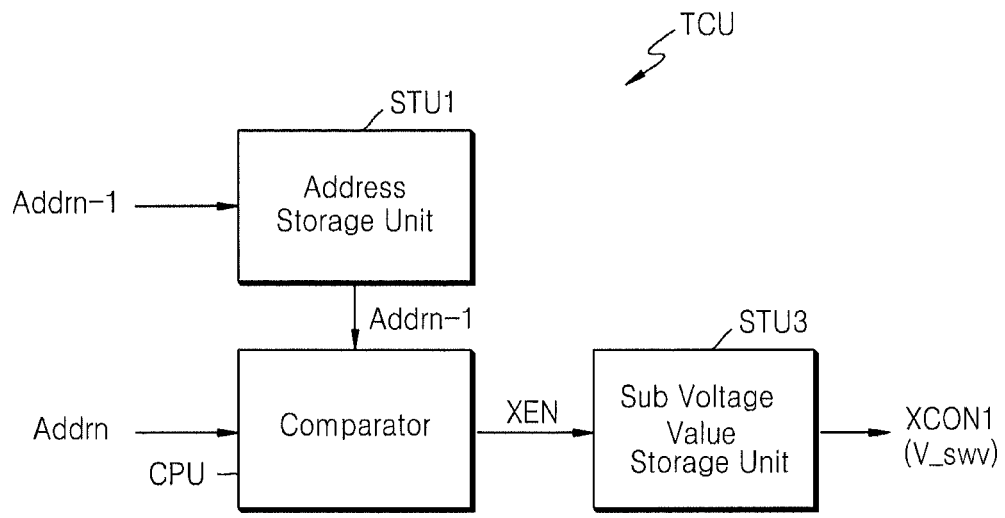
FIG. 16 is a block diagram of another example of the transition control unit illustrated in FIG. 1.

FIG. 16 is a block diagram of another example of the transition control unit TCU illustrated in FIG. 1. Referring to FIGS. 1, 15, and 16, the transition control unit TCU may include the address storage unit STU1, the comparator CPU, and a sub voltage value storage unit STU3. The address storage unit STU1 stores the previous address Addrn−1. The previous address Addrn−1 refers to an address where a previous command is executed until a clock immediately prior to a current command is enabled. If the current address Addrn is received, the comparator CPU compares the previous address Addrn−1 stored in the address storage unit STU1, to the current address Addrn. If the previous address Addrn−1 and the current address Addrn are different, that is, if a word line voltage of a word line corresponding to the previous address Addrn−1 should be transitioned from the first word line voltage VWL1 to the second word line voltage VWL2, the comparator CPU generates the enable signal XEN. The sub voltage value storage unit STU3 may output the first control signal XCON1 including sub voltage values V_swv of the first word line voltage VWL1 in a time period for transitioning a word line voltage of a word line corresponding to the previous address Addrn−1 from the first word line voltage VWL1 to the second word line voltage VWL2, in response to the enable signal XEN.

For example, in some embodiments, the number and levels of the sub voltage values V_swv of the first word line voltage VWL1 may be set in such a way that electrons accumulated in the first gate GT1 do not move to the drain D2 of the second memory cell MC2 and sufficiently react in the source S. Alternatively, when a gate voltage of the third gate GT3 of FIG. 9 is transitioned from the first word line voltage VWL1 to the second word line voltage VWL2, the number and levels of the sub voltage values V_swv of the first word line voltage VWL1 may be set in such a way that electrons accumulated in the element isolation region EIR between the second and third memory cells MC2 and MC3 do not move to the source S of the second memory cell MC2 and sufficiently react in the drain D2 of the second memory cell MC2.

For example, in some embodiments, the first word line voltage VWL1 may be reduced sequentially over n sub word line voltages sVWL1# in a step-wise function instead of being linearly and rapidly reduced from 3V to −0.4V, and thus charge accumulated in the first gate GT1 is prevented from moving to the drain D2 of the second memory cell MC2, or electrons accumulated in the element isolation region EIR are prevented from moving to the source S of the second memory cell MC2.

In some embodiments, the time period Δtb for transitioning the first word line voltage VWL1 to the second word line voltage VWL2 may be the same as the time period Δta for transitioning the second word line voltage VWL2 to the first word line voltage VWL1. Embodiments are however, not limited thereto. As shown in FIG. 15, the first word line voltage VWL1 may be reduced sequentially over n sub word line voltages in a time period for transitioning the first word line voltage VWL1 to the second word line voltage VWL2 and, as shown in FIG. 10, the time period Δtb for transitioning the first word line voltage VWL1 to the second word line voltage VWL2 may be different from the time period Δta for transitioning the second word line voltage VWL2 to the first word line voltage VWL1. Also, when the second word line voltage VWL2 is transitioned to the first word line voltage VWL1, the second word line voltage VWL2 may be linearly increased as shown in FIG. 15

Figure 17A:
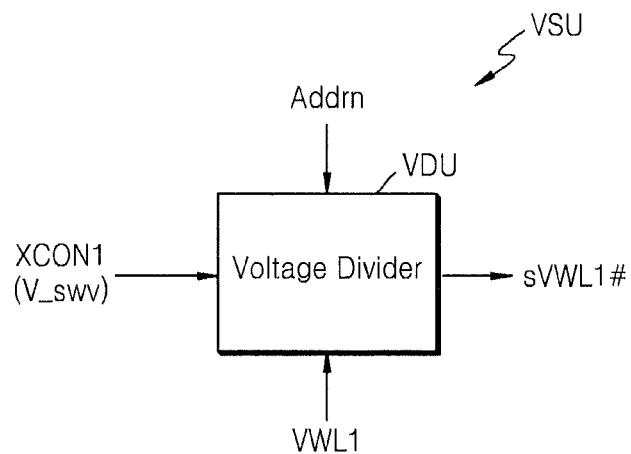
FIGS. 17A through 17E are diagrams showing other examples of the word line voltage supplying unit illustrated in FIG. 1.

FIG. 17A is a block diagram showing another example of the word line voltage supplying unit VSU illustrated in FIG. 1. Referring to FIGS. 1 and 17A, the word line voltage supplying unit VSU may include a voltage divider VDU. When a word line voltage supplied to a word line corresponding to the address Addr is transitioned to the first or second word line voltage VWL1 or VWL2, the voltage divider VDU may sequentially supply the n sub word line voltages sVWL1# of the first word line voltage VWL1 in response to the first control signal XCON1. The voltage divider VDU may be implemented as a resistor string (not shown) in which resistors are connected in series, and wherein an output node (not shown) is positioned between arbitrary resistors of the resistor string.

Embodiment are, however, not limited thereto. In some embodiments, the transition control unit TCU of FIG. 16 may generate only a comparison result of the previous address Addrn−1 and the current address Addrn as the first control signal XCON1, and the voltage divider VDU of the word line voltage supplying unit VSU of FIG. 17 may sequentially output the n sub word line voltages sVWL1# of the first word line voltage VWL1 by using the preset sub voltage values V_swv.

Figure 17B:
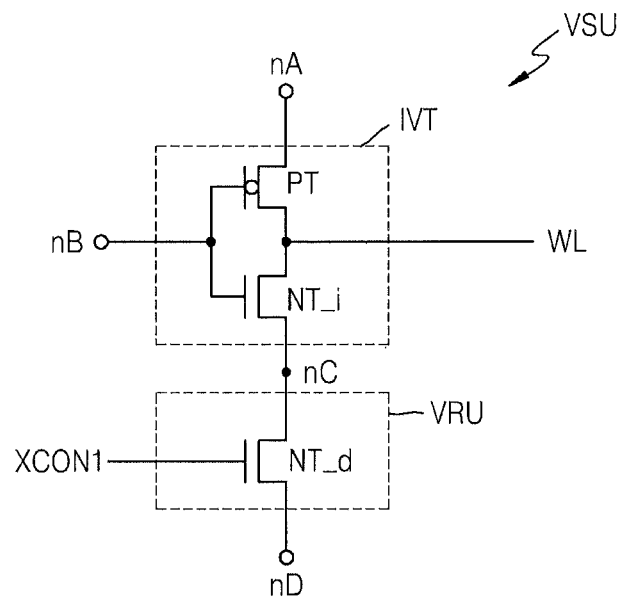

FIG. 17B is a circuit diagram showing another example of the word line voltage supplying unit VSU illustrated in FIG. 1. Referring to FIGS. 1 and 17B, the word line voltage supplying unit VSU may include a voltage supplying unit IVT and a voltage drop control unit VRU. The voltage supplying unit IVT may supply a word line voltage that changes from a voltage of a connected first node nA to the voltage of a connected third node nC, to a word line WL in response to a signal supplied to a connected second node nB. If the voltage of the first node nA is logic high (H), the voltage of the first node nA may be the same as or similar to the first word line voltage VWL1. If the voltage of the third node nC is logic low (L), the voltage of the third node nC may be the same as or similar to the second word line voltage VWL2. In some embodiments the voltage supplying unit IVT may be an inverter connected to a power supply voltage line of the first node nA, controlled due to a signal supplied to the second node nB, and for outputting a voltage of the word line WL.

For example, the voltage supplying unit IVT may be an inverter having a gate connected to the second node nB, and including a p-type metal-oxide semiconductor (PMOS) transistor PT and an n-type metal-oxide semiconductor (NMOS) transistor NT_i connected in series between the first and third nodes nA and nC. In this case, when a logic low (L) signal is supplied to the second node nB so as to turn on the PMOS transistor PT and to turn off the NMOS transistor NT_i, the voltage supplying unit IVT may supply the voltage of the first node nA to the word line WL as the first word line voltage VWL1. Also, when a logic high (H) signal is supplied to the second node nB so as to turn off the PMOS transistor PT and to turn on the NMOS transistor NT_i, the voltage supplying unit IVT may supply the voltage of the third node nC to the word line WL as the second word line voltage VWL2. Although the voltage supplying unit IVT of the example embodiment comprises an inverter including one PMOS transistor PT and one NMOS transistor NT_i in FIG. 17B, embodiments of the present inventive concepts are not limited thereto.

The voltage drop control unit VRU may drop the voltage of the connected third node nC sequentially to n sub word line voltages, in response to the first control signal XCON1. For example, the voltage drop control unit VRU may control a voltage obtained by subtracting the voltage of the third node nC from the voltage of the first node nA, to be dropped sequentially to the n sub word line voltages. For example, when the voltage supplying unit IVT transitions the word line voltage supplied to the word line WL from the first word line voltage VWL1 to the second word line voltage VWL2, the voltage drop control unit VRU may control the voltage of the third node nC to be reduced sequentially over the n sub word line voltages of the first word line voltage VWL1 as shown in FIG. 15. The voltage drop control unit VRU may include an NMOS transistor NT_d connected to the NMOS transistor NT_i of the inverter IVT and the third node nC. In some embodiments, the NMOS transistor NT_d of the voltage drop control unit VRU may be enabled in response to the first control signal XCON1.

Figure 17C:
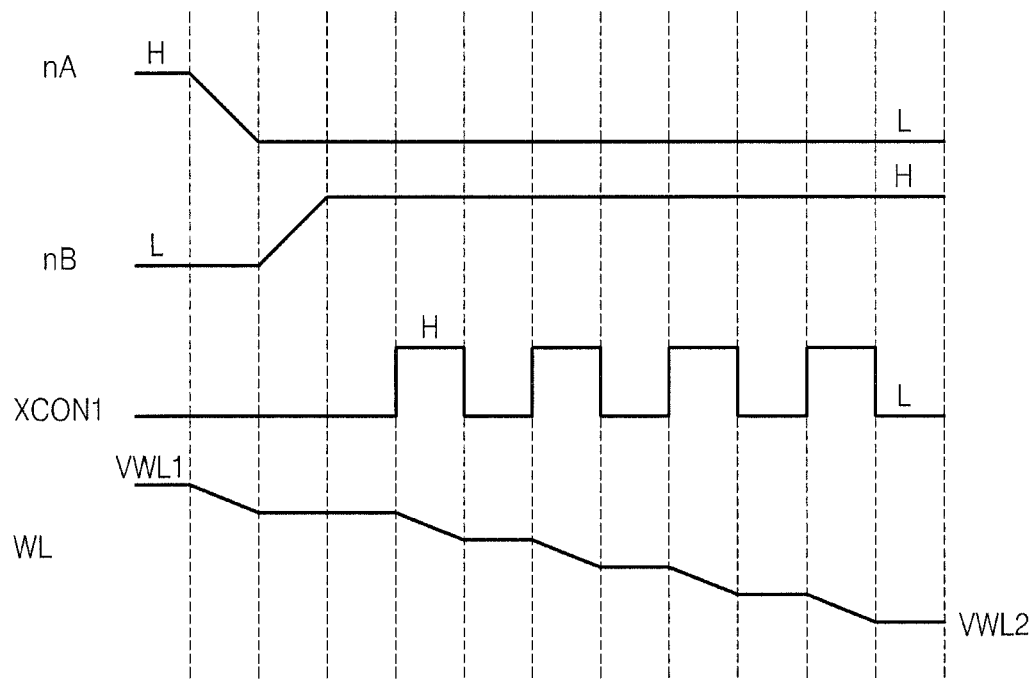

FIG. 17C is a timing diagram of the operation of the circuit of FIG. 17B. Referring to FIGS. 1, 17B, and 17C, when a voltage of the first node nA or a signal supplied to the first node nA is transitioned from logic high (H) to logic low (L), a voltage of the second node nB or a signal supplied to the second node nB may be transitioned from logic low (L) to logic high (H). As such, a voltage of the word line WL is reduced. The first control signal XCON1 may be generated as a square wave having at least two pulses. FIG. 17C shows that the first control signal XCON1 has four pulses. As described above, the first control signal XCON1 may be generated by the transition control unit TCU.

A first pulse of the first control signal XCON1 may be generated after a predetermined time has passed after the voltage of the first or second node nA or nB is transitioned. However, embodiments of the present inventive concepts are not limited thereto. The first control signal XCON1 may be enabled simultaneously with the transition of the voltage of the first or second node nA or nB. The NMOS transistor NT_d of the voltage drop control unit VRU is turned on when each pulse of the first control signal XCON1 is generated, and is turned off in periods between pulses. As such, a voltage of the third node nC connected to one end of the NMOS transistor NT_d of the voltage drop control unit VRU is full-down due to the influence of a voltage of a fourth node nD connected to another end of the NMOS transistor NT_d of the voltage drop control unit VRU.

If the NMOS transistor NT_d of the voltage drop control unit VRU is repeatedly turned on and off in response to the first control signal XCON1, the voltage of the word line WL may be reduced sequentially to predetermined sub word line voltages, and thus may be transitioned to the second word line voltage VWL2.

Figure 17D:
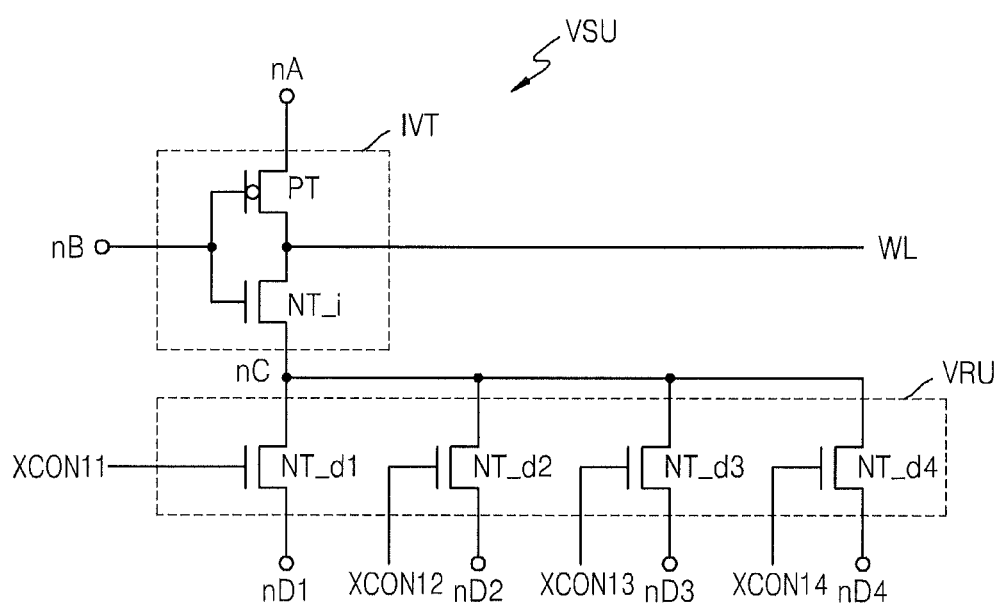

FIG. 17D is a circuit diagram showing another example of the word line voltage supplying unit VSU illustrated in FIG. 1. Referring to FIGS. 1 and 17D, the word line voltage supplying unit VSU may include the voltage supplying unit IVT and the voltage drop control unit VRU. The configuration and operation of the word line voltage supplying unit VSU of FIG. 17D may be similar to those of the word line voltage supplying unit VSU of FIG. 17B. However, the voltage drop control unit VRU of the word line voltage supplying unit VSU of FIG. 17D may include a plurality of NMOS transistors connected to the third node nC. FIG. 17D shows that the voltage drop control unit VRU of the present embodiment includes four NMOS transistors NT_d1, NT_d2, NT_d3, and NT_d4.

Figure 17E:
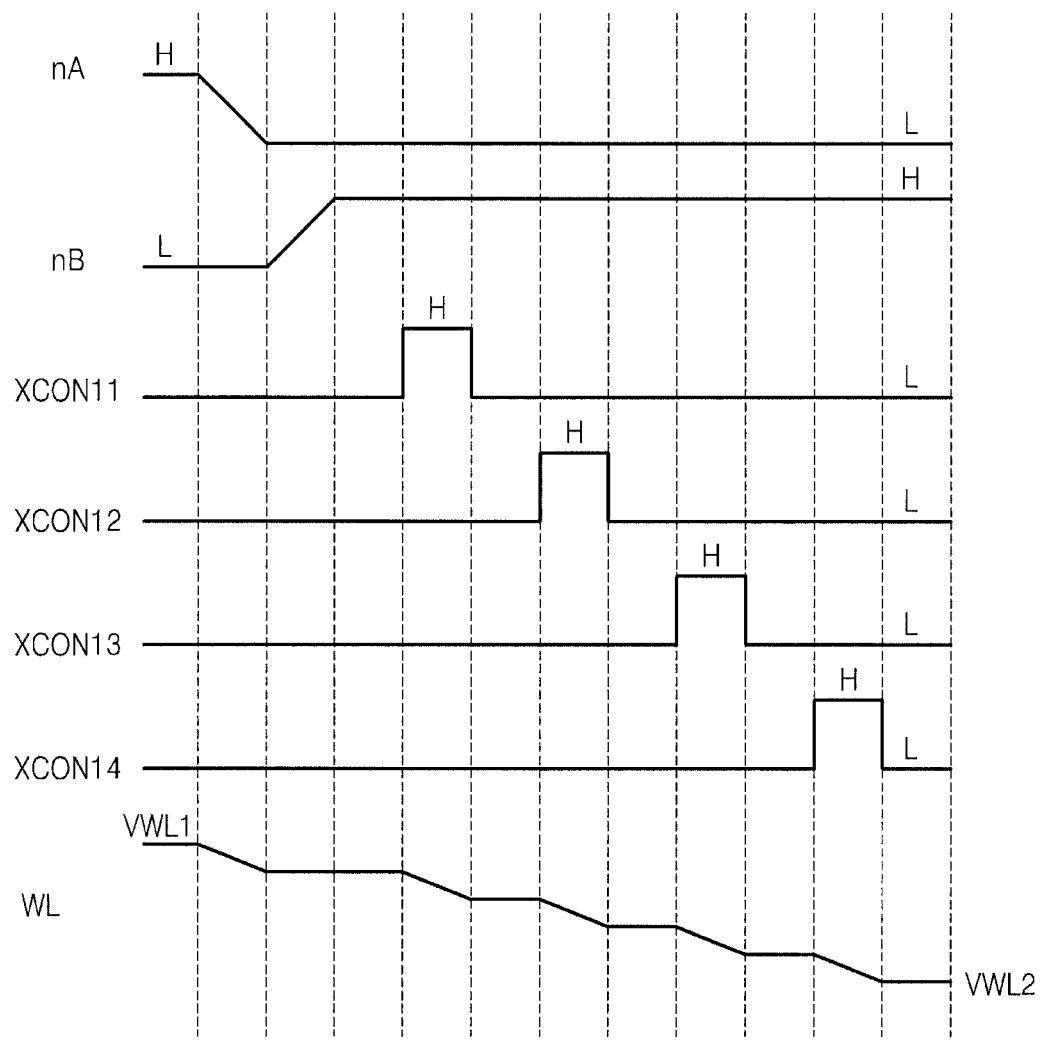

The four NMOS transistors NT_d1, NT_d2, NT_d3, and NT_d4 are respectively turned on and off in response to corresponding first control signals XCON11, XCON12, XCON13, and XCON14. The first control signals XCON11, XCON12, XCON13, and XCON14 may be sequentially enabled as illustrated in FIG. 17E that is a timing diagram of the operation of FIG. 17D. As such, the four NMOS transistors NT_d1, NT_d2, NT_d3, and NT_d4 may be sequentially turned on and off Since the four NMOS transistors NT_d1, NT_d2, NT_d3, and NT_d4 are sequentially turned on and off, a voltage of the word line WL may be reduced sequentially to predetermined sub word line voltages, and thus may be transitioned to the second word line voltage VWL2.

Although the four NMOS transistors NT_d1, NT_d2, NT_d3, and NT_d4 are gated due to the different first control signals XCON11, XCON12, XCON13, and XCON14 in FIGS. 17B and 17E, the current embodiment is not limited thereto. As shown in FIG. 17C, the four NMOS transistors NT_d1, NT_d2, NT_d3, and NT_d4 may be sequentially gated at different time points due to the same first control signal XCON1.

Although the four NMOS transistors NT_d1, NT_d2, NT_d3, and NT_d4 are gated due to the different first control signals XCON11, XCON12, XCON13, and XCON14 in FIGS. 17B and 17E, the current embodiment is not limited thereto. As shown in FIG. 17C, the four NMOS transistors NT_d1, NT_d2, NT_d3, and NT_d4 may be sequentially gated at different time points due to the same first control signal XCON1.

Referring back to FIGS. 1 and 3, although the conductivity between the gate GT1 of the transistor Tr of the first memory cell MC1 and the drain D2 of the transistor Tr of the second memory cell MC2 is high when a word line voltage of an arbitrary word line is transitioned from the first word line voltage VWL1 to the second word line voltage VWL2, as described above in relation to FIG. 10 or 15, if a time or shape when the selected word line voltage VWL1 is transitioned to the non-selected word line voltage VWL2 is set in such a way that electrons accumulated in the first gate GT1 do not move to the drain D2 of the second memory cell MC2 and sufficiently react in the source S, the conductivity between the gate GT1 of the transistor Tr of the first memory cell MC1 and the drain D2 of the transistor Tr of the second memory cell MC2 may be reduced.

As such, even in a case where a word line voltage of adjacent arbitrary word lines is transitioned from the first word line voltage VWL1 to the second word line voltage VWL2, the flow of charge is prevented between the gate GT1 of the transistor Tr of the first memory cell MC1 and the drain D2 of the transistor Tr of the second memory cell MC2.

Also, as described above in relation to FIG. 10 or 15, when a gate voltage of the third gate GT3 of FIG. 9 is transitioned from the first word line voltage VWL1 to the second word line voltage VWL2, if a time or shape when the selected word line voltage VWL1 is transitioned to the non-selected word line voltage VWL2 is set in such a way that electrons accumulated in the element isolation region EIR between the second and third memory cells MC2 and MC3 do not move to the source S of the second memory cell MC2 and sufficiently react in the drain D2 of the second memory cell MC2, even when a word line voltage of adjacent arbitrary word lines is transitioned from the first word line voltage VWL1 to the second word line voltage VWL2, a voltage variation of the drain D2 of the transistor Tr of the second memory cell MC2 may be prevented.

In other words, according to the memory device MDEV and the memory system MSYS, the 1-row disturbance phenomenon that causes a voltage variation of a drain terminal of adjacent memory cells when a word line voltage supplied to adjacent word lines is transitioned from a selected word line voltage to a non-selected word line voltage may be prevented.

Referring back to FIG. 1, assume a word line of the memory cell array MCA corresponding to the address Addr has a voltage level of a voltage supplied from the word line voltage supplying unit VSU. If the voltage supplied form the word line voltage supplying unit VSU is the second word line voltage VWL2, for example, a non-selected word line voltage, the word line is considered disabled. If the voltage supplied form the word line voltage supplying unit VSU is the first word line voltage VWL1, for example, a selected word line voltage, the word line is considered enabled, and an operation such as write or read may be performed on an arbitrary memory cell connected to the word line.

Figure 18:
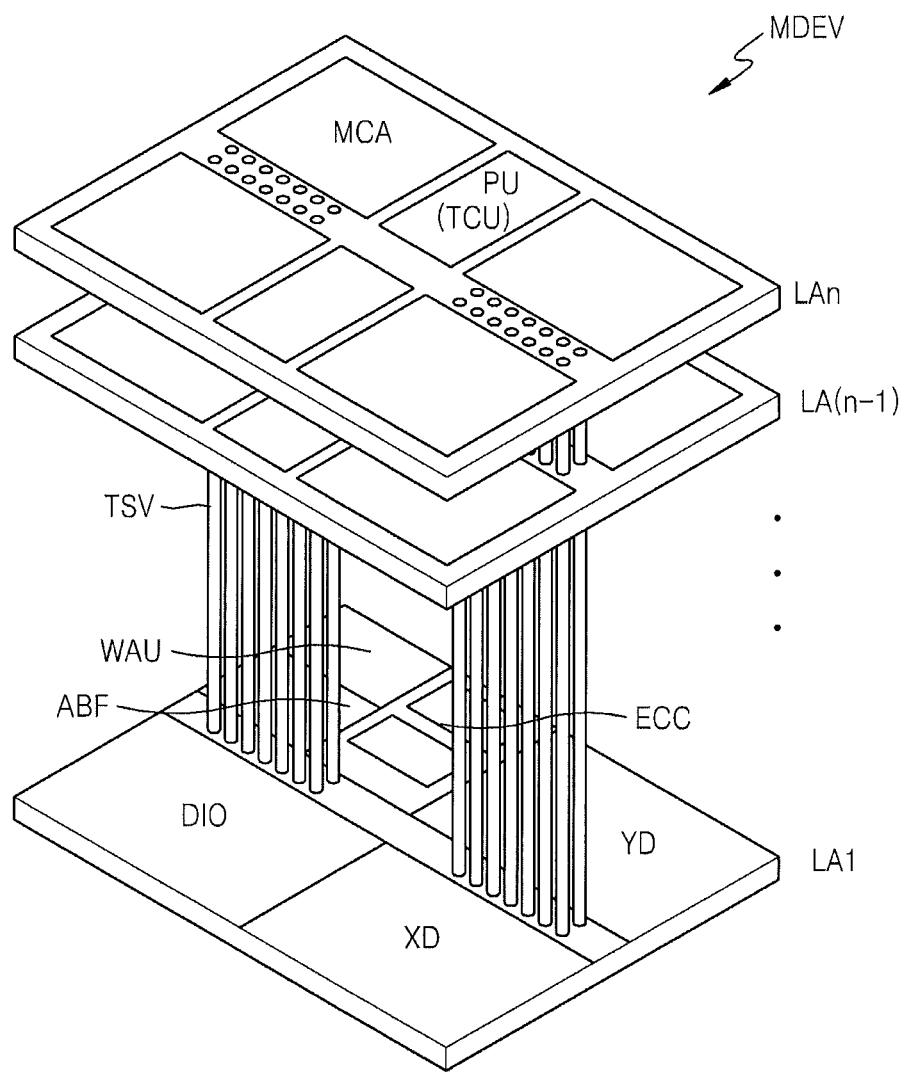
FIG. 18 is a perspective diagram of a memory device according to another embodiment of the inventive concepts.

FIG. 18 is a perspective diagram of a memory device MDEV formed by stacking a plurality of semiconductor layers, according to another embodiment of the inventive concepts. As illustrated in FIG. 18, the memory device MDEV may include first through nth semiconductor layers LA1 through LAn. Each of the first through nth semiconductor layers LA1 through LAn may comprise a DRAM chip including DRAM cells. Alternatively, some of the first through nth semiconductor layers LA1 through LAn may comprise master chips for interfacing with an external memory controller, and others may be slave chips for storing data. In FIG. 18, it is assumed that the bottom first semiconductor layer LA1 is a master chip and the other second through nth semiconductor layers LA2 through LAn are slave chips.

The first through nth semiconductor layers LA1 through LAn transmit and receive signals to and from each other via through silicon vias TSV, the first semiconductor layer LA1 communicates with the memory controller via a conductive element (not shown) formed on an external surface. The configuration and operation of the memory device MDEV will now be described with respect to the first semiconductor layer LA1 as a master chip and the nth semiconductor layer LAn as a slave chip. The first semiconductor layer LA1 may include various circuits for driving memory cell arrays MCA included in the slave chips. For example, in some embodiments, the first semiconductor layer LA1 may include a row driver (x-driver) XD for driving word lines of the memory cell arrays MCA, a column driver (y-driver) YD for driving bit lines of the memory cell arrays MCA, a data input/output unit DIO for controlling input/output of data, a write command determination unit WAU, and an address buffer ABF receiving an address from an external device and buffering the address. In order to prevent 1-row disturbance generated in a transition period for disabling an enabled word line, the memory device MDEV may include the transition control unit TCU. The nth semiconductor layer LAn may include the memory cell array MCA, and other peripheral circuits for driving the memory cell array MCA, for example, a row/column selection unit for selecting a row and column of the memory cell array MCA, and a peripheral circuit area PU where a bit line sense amplifier (not shown) is located. The transition control unit TCU may be located on the peripheral circuit area PU. Data (write data or modulation data) to be written in the second through nth semiconductor layers LA2 through LAn may be provided from the first semiconductor layer LA1 via the through silicon vias TSV.

Figure 19:
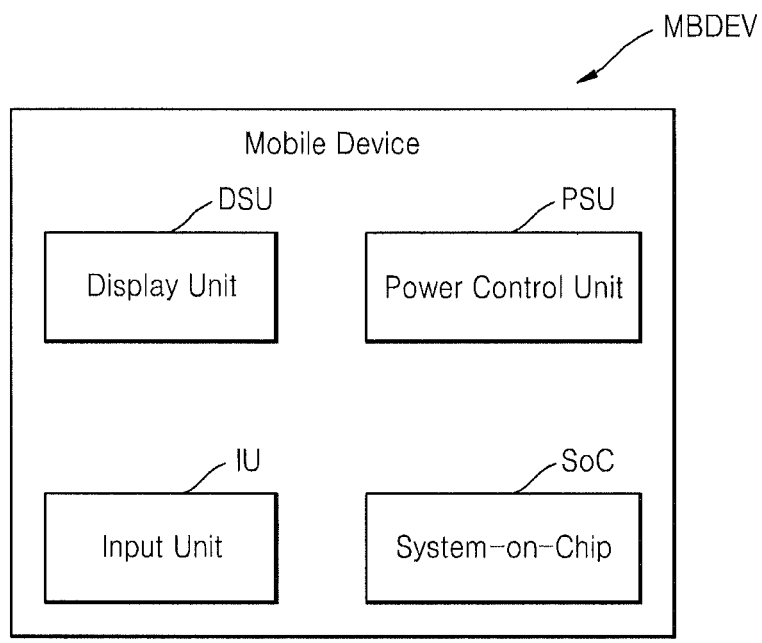
FIG. 19 is a block diagram of a mobile device according to an embodiment of the inventive concepts.

FIG. 19 is a block diagram of a mobile device MBDEV according to an embodiment of the inventive concepts. Referring to FIG. 19, the mobile device MBDEV may include a display unit DSU that operates as a user interface, an input unit IU, e.g., a key pad or a touch screen, for receiving a user input, a power management unit PCU for controlling power supply to the mobile device MBDEV, and a system-on-chip SoC. Examples of the mobile device MBDEV include various devices such as a mobile phone, a smartphone, an audio device such as an MP3 player, a laptop computer, and a tablet PC, and other devices according to various functions of the mobile device MBDEV may be further included in the mobile device MBDEV. The system-on-chip SoC includes a memory device and/or a memory system according to an embodiment of the inventive concepts, and includes the memory cell array MCA, the word line voltage supplying unit VSU, and the transition control unit TCU capable of preventing 1-row disturbance generated in a transition period for disabling an enabled word line, thereby improving the reliability of the mobile device MBDEV.

Figure 20:
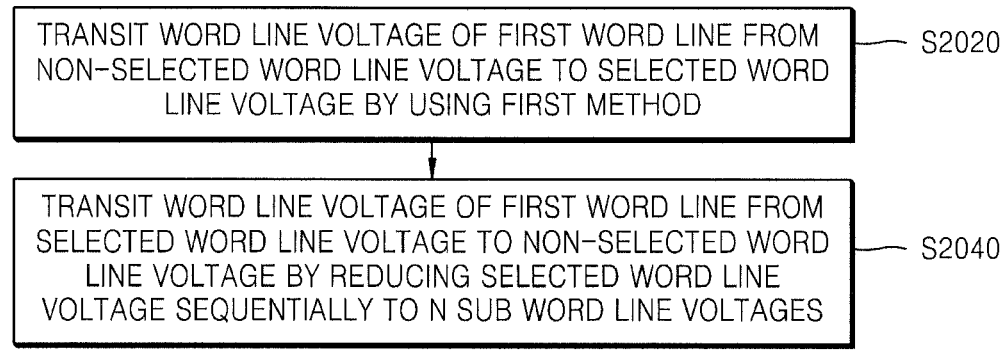
FIG. 20 is a flowchart of an operation method of a memory device, according to an embodiment of the inventive concepts.

FIG. 20 is a flowchart of an operation method of a memory device, according to an embodiment of the inventive concepts. Referring to FIGS. 1 and 20, the operation method includes operation S2020 for transitioning a word line voltage of a first word line from the non-selected word line voltage VWL2 to the selected word line voltage VWL1 by using a first method; and operation S2020 for transitioning the word line voltage of the first word line from the selected word line voltage VWL1 to the non-selected word line voltage VWL2 by reducing the selected word line voltage VWL1 sequentially over n sub word line voltages as shown in FIG. 15 without causing a time delay. However, as described herein, embodiments of the present inventive concepts are not limited thereto. The operation method of the memory device may comprise, in some embodiments, a method requiring a relatively longer time for transition, in comparison to the first method, as shown in FIG. 10. As such, according to the operation method of the memory device, since a time or shape of the voltage waveform when the selected word line voltage VWL1 is transitioned to the non-selected word line voltage VWL2 is set in such a way that electrons accumulated in the first gate GT1 do not move to the drain D2 of the second memory cell MC2 and sufficiently react in the source S, the flow of electrons may be prevented between the gate GT1 of the transistor Tr of the first memory cell MC1 and the drain D2 of the transistor Tr of the second memory cell MC2.

As described above, according to the memory device MDEV, the memory system MSYS, and the operation method thereof, even in a case where a voltage supplied to a gate of a transistor of adjacent memory cells varies, misreading of stored data may be minimized and thus the reliability of the memory device MDEV or the memory system MSYS, may be improved. Also, according to the memory device MDEV, the memory system MSYS, and the operation method thereof, since a time when a selected word line voltage is transitioned to a non-selected word line voltage is changed within the row pre-charge time tRP, misreading of stored data due to a variation in a voltage supplied to a gate of a transistor of adjacent memory cells may be prevented without increasing an operation time.

Furthermore, according to the memory device MDEV, the memory system MSYS, and the operation method thereof, since on-current characteristics of a memory cell are not reduced, misreading of stored data due to a variation in a voltage supplied to a gate of a transistor of adjacent memory cells may be prevented without increasing power consumption. For example, in order to prevent the flow of electrons between the gate GT1 of the transistor Tr of the first memory cell MC1 and the drain D2 of the transistor Tr of the second memory cell MC2 illustrated in FIG. 5, if an energy barrier is increased by increasing a doping density between the gate GT1 of the transistor Tr of the first memory cell MC1 and the drain D2 of the transistor Tr of the second memory cell MC2, that is, under the gate GT2 of the transistor Tr of the second memory cell MC2, an on-current of the transistor Tr of the second memory cell MC2 may be reduced. In this case, since a higher current should be supplied to a memory cell in order to reliably perform an operation of the memory device MDEV, power consumption of the memory device MDEV or the memory system MSYS may be increased.

In addition, according to the memory device MDEV, the memory system MSYS, and the operation method thereof, since a physical structure of a memory cell is not changed, misreading of stored data due to a variation in a voltage supplied to a gate of a transistor of adjacent memory cells may be prevented without increasing manufacturing costs due to a process change. For example, in order to prevent the flow of electrons between the gate GT1 of the transistor Tr of the first memory cell MC1 and the drain D2 of the transistor Tr of the second memory cell MC2 illustrated in FIG. 5, if the length of a fin of the gate GT2 of the transistor Tr of the second memory cell MC2 is increased, manufacturing costs may be increased due to a process change.

Figure 21:
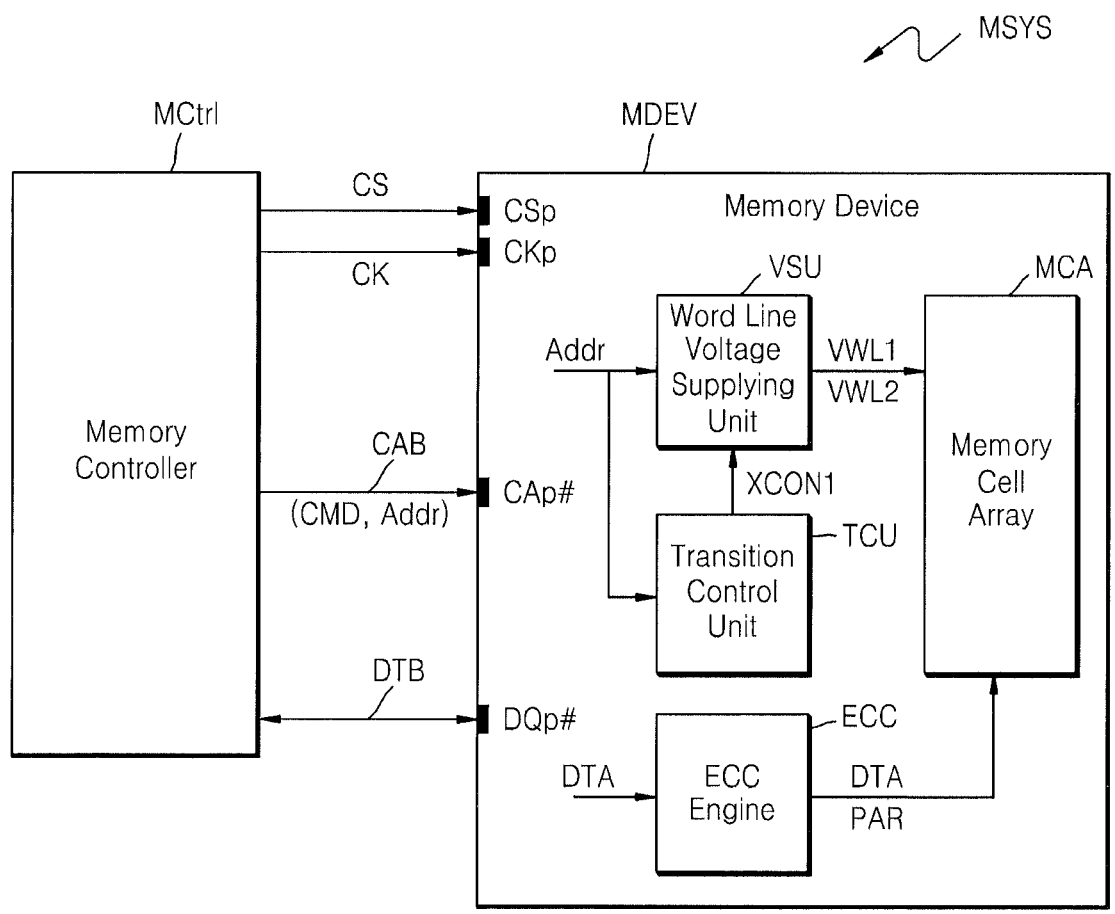
FIGS. 21 through 24 are block diagrams of memory systems according to other embodiments of the inventive concepts.

FIG. 21 is a block diagram of a memory system MSYS according to another embodiment of the inventive concepts. Referring to FIG. 21, the memory system MSYS may include the memory controller MCtrl and the memory device MDEV. The memory controller MCtrl is configured to control memory operations by providing various control signals, a command/address signal, or data to the memory device MDEV. The memory device MDEV enables a word line of the memory cell array MCA corresponding to an address indicated due to the command/address signal received from the memory controller MCtrl. Like the memory device MDEV of FIG. 1, the memory device MDEV of FIG. 21 may include the memory cell array MCA, the word line voltage supplying unit VSU, and the transition control unit TCU capable of preventing 1-row disturbance generated in a transition period for disabling an enabled word line, and thus may improve the reliability of the memory device MDEV or the memory system MSYS. In addition, the memory device MDEV of FIG. 22 may further include an error correction engine ECC for correcting an error included in data DTA input from the memory controller MCtrl via the data bus DTB.

The error correction engine ECC may perform various functions related to error detection and correction. For example, the error correction engine ECC may generate parity bits PAR by performing error correction code encoding in a data write operation, and may correct error bits generated in read data by performing error correction code decoding in a data read operation. The data DTA and the parity bits PAR may be respectively stored in a normal data storage area (not shown) and a parity storage area (not shown) of the memory cell array MCA corresponding to the address Addr. For example, the error correction engine ECC may include an error correction code encoder (not shown) for generating parity bits, an error detection unit (not shown) for detecting error bits generated in read data (or code words including data and parity bits), and an error correction unit (not shown) for correcting the error bits. According to the memory system MSYS of FIG. 21, since the error correction engine ECC for correcting an error included in a transmission process or generated in a storing process is included in the memory device MDEV, the reliability of the memory device MDEV or the memory system MSYS may be improved.

Figure 22:
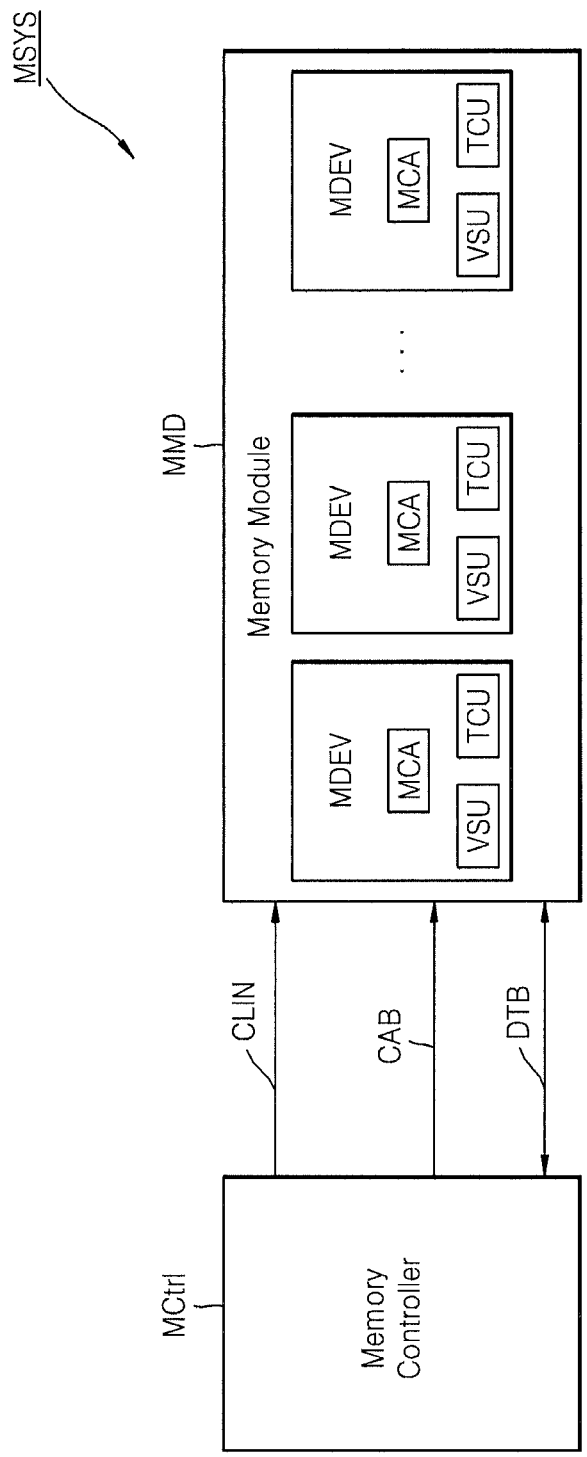
Figure 23:
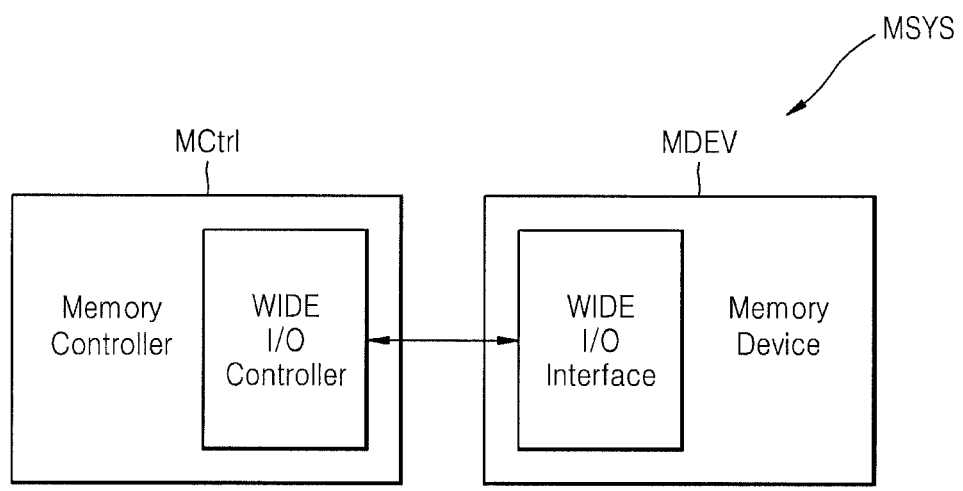

FIGS. 22 and 23 are block diagrams of memory systems MSYS according to other embodiments of the inventive concepts. Referring to FIG. 22, the memory system MSYS includes a memory module MMD and the memory controller MCtrl. Also, the memory module MMD includes one or more memory devices MDEV mounted on a module board and each of the memory devices MDEV may comprise, for example, a DRAM chip. Also, the memory device MDEV may comprise the memory device MDEV according to any one of the previous embodiments.

The memory controller MCtrl outputs various signals for controlling the memory devices MDEV included in the memory module MMD. For example, the memory controller MCtrl may output various command/address signals (CA signals) for memory operations, and control signals other than the CA signals. Since each of the memory devices MDEV includes the memory cell array MCA, the word line voltage supplying unit VSU, and the transition control unit TCU for enabling a word line corresponding to a command/address signal supplied via the command/address bus CAB and capable of preventing 1-row disturbance generated in a transition period for disabling the enabled word line, the reliability of the memory system MSYS may be improved.

Referring to FIG. 23, the memory system MSYS includes the memory controller MCtrl and the memory device MDEV, and the memory device MDEV includes the memory cell array MCA, the word line voltage supplying unit VSU, and the transition control unit TCU, thereby improving the reliability of the memory system MSYS. In the memory system MSYS of FIG. 23, the memory device MDEV may be, for example, a LPDDR DRAM adopting an interface as a wide input/output interface, and the memory controller MCtrl may include a wide input/output controller for communicating with the memory device MDEV via the wide input/output interface. The wide input/output interface of the memory system MSYS of FIG. 23 may be driven at power of 1.2V, may operate at 4-channel 128 bits, and may have a data rate of 2133 Mtps.

Figure 24:
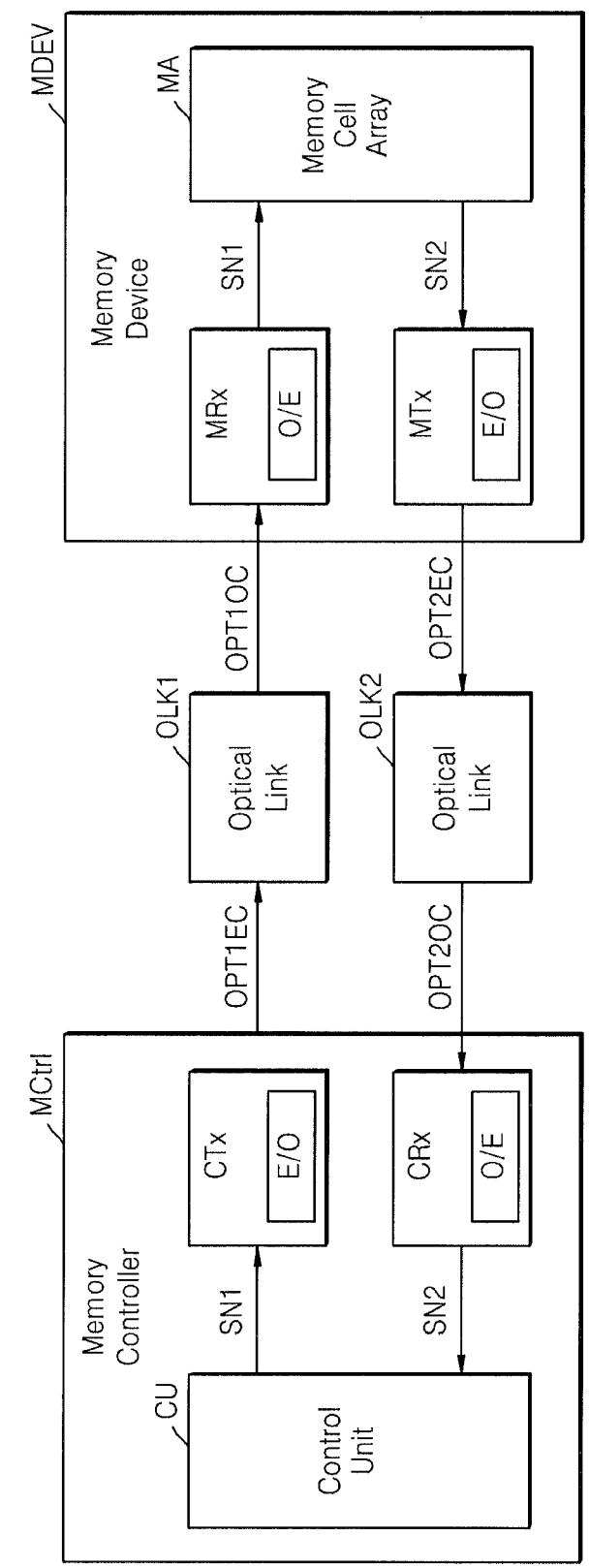

FIG. 24 is a block diagram of a memory system MSYS according to another embodiment of the inventive concepts. The memory system MSYS of FIG. 24 includes first and second optical link devices OLK1 and OLK2, the memory controller MCtrl, and the memory device MDEV. The memory device MDEV may be a DRAM chip. The first and second optical link devices OLK1 and OLK2 interconnect the memory controller MCtrl and the memory device MDEV. In some embodiments, the memory controller MCtrl includes a control unit CU, a first transmission unit CTx, and a first reception unit CRx. The control unit CU transmits a first electric signal SN1 to the first transmission unit CTx. The first electric signal SN1 may include, for example, a CA signal, a clock signal, and data transmitted to the memory device MDEV.

In some embodiments, the first transmission unit CTx includes an optical modulator E/O for transforming the first electric signal SN1 to a first optical transmission signal OPT1EC and transmitting the first optical transmission signal OPT1EC to the first optical link device OLK1. The first optical transmission signal OPT1EC is transmitted to the first optical link device OLK1 via serial communication. The first reception unit CRx includes an optical demodulator O/E for transforming a second optical reception signal OPT2OC received from the second optical link device OLK2, to a second electric signal SN2 and transmitting the second electric signal SN2 to the control unit CU. The memory device MDEV includes a second reception unit MRx, the memory cell array MCA, and a second transmission unit MTx. The second reception unit MRx includes an optical demodulator O/E for transforming a first optical reception signal OPT1OC received from the first optical link device OLK1, to the first electric signal SN1 and transforming the first electric signal SN1 to the memory cell array MCA.

The memory cell array MCA writes write data in a memory cell in response to the first electric signal SN1, or transmits read data as the second electric signal SN2 to the second transmission unit MTx. The second electric signal SN2 may include, for example, a clock signal and read data to be transmitted to the memory controller MCtrl. The second transmission unit MTx includes an optical modulator E/O for transforming the second electric signal SN2 to a second optical transmission signal OPT2EC and transmitting the second optical transmission signal OPT2EC to the second optical link device OLK2. The second optical transmission signal OTP2EC is transmitted to the second optical link device OLK2 via serial communication. Although not shown in FIG. 24, in order to prevent 1-row disturbance generated in a transition period for disabling an enabled word line, the memory device MDEV may include the word line voltage supplying unit VSU and the transition control unit TCU.

Figure 25:
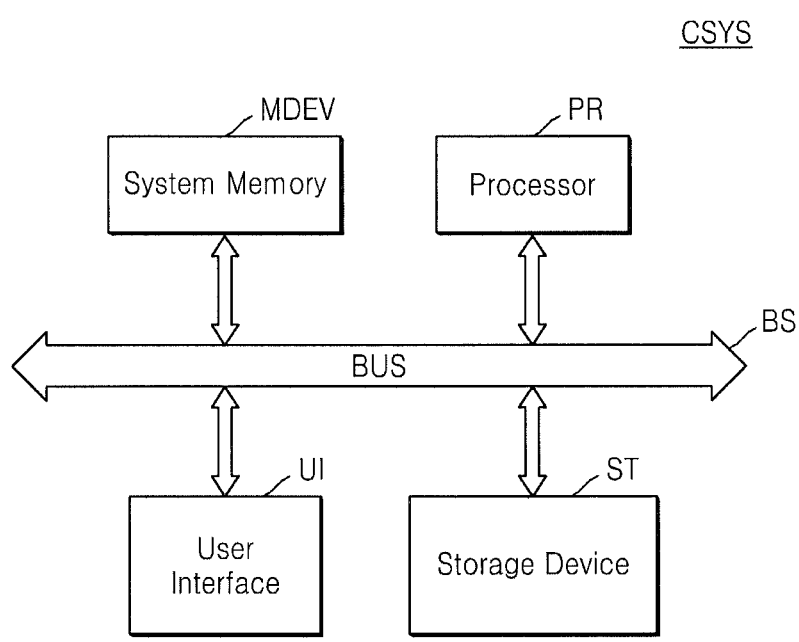
FIG. 25 is a block diagram of a computing system according to an embodiment of the inventive concepts.

FIG. 25 is a block diagram of a computing system CSYS including a memory system, according to an embodiment of the inventive concepts. The computing system CSYS such as a mobile device or a desktop computer may include a system memory MDEV as a memory device. The memory device included as the system memory MDEV may be the memory device MDEV according to any one of the previous embodiments. For example, the system memory MDEV may be the memory device MDEV according to an embodiment of the inventive concepts, and may include the word line voltage supplying unit VSU and the transition control unit TCU in order to prevent 1-row disturbance generated in a transition period for disabling an enabled word line. Also, the system memory MDEV of FIG. 25 may include a memory device and a memory controller. The computing system CSYS includes a processor PR, the system memory MDEV, a user interface UI, and a storage device ST including a non-volatile memory, which are electrically connected to a bus BS. The storage device ST may be a mass storage such as a solid state drive (SSD) or a hard disk drive (HDD).

While the inventive concepts have been particularly shown and described with reference to exemplary embodiments thereof, it will be understood by one of ordinary skill in the art that various changes in form and details may be made herein without departing from the spirit and scope of the inventive concepts as defined by the following claims. For example, although the word line voltage supplying unit VSU and the transition control unit TCU are separate elements in the above description, the inventive concepts are not limited thereto. The word line voltage supplying unit VSU and the transition control unit TCU may be formed as one element so as to control a word line voltage. Therefore, the scope of the inventive concepts is defined not by the detailed description of the inventive concepts but by the following claims, and all differences within the scope will be construed as being included in the inventive concepts.

What is claimed is:
1. A memory device comprising:
   a memory cell array comprising first and second word lines located adjacent to each other, a first memory cell connected to the first word line, and a second memory cell connected to the second word line and located adjacent to the first memory cell;
   a word line voltage supplying unit that transitions a word line voltage of the first word line from a first word line voltage to a second word line voltage, in response to a first control signal; and
   a transition control unit that generates the first control signal for controlling a pulse of the first word line voltage of the first word line in a transition period from the first word line voltage to the second word line voltage in such a way that a transition waveform profile from the first word line voltage to the second word line voltage is different from a transition waveform profile from the second word line voltage to the first word line voltage;
   wherein the first word line voltage is a selected word line voltage and the second word line voltage is a non-selected word line voltage, and wherein the transition control unit generates the first control signal so that a time period taken to transition the first word line voltage to the second word line voltage is longer than a time period taken to transition the second word line voltage to the first word line voltage.

2. The memory device of claim 1, wherein the memory device is a dynamic random access memory (DRAM) device, and
wherein the time period taken to transition the first word line voltage to the second word line voltage is set to correspond to a row cycle time set with respect to the memory device.

3. The memory device of claim 2, wherein the time period taken to transition the first word line voltage to the second word line voltage is set to be equal to or longer than ½ of a time period from a first time point for starting to transition the first word line voltage to the second word line voltage, to a second time point for ending a row pre-charge time of the first word line.

4. The memory device of claim 1, wherein the word line voltage supplying unit comprises a delay unit that delays the transition period from the first word line voltage to the second word line voltage, in response to the first control signal.

5. The memory device of claim 1, wherein the transition control unit generates the first control signal so that the first word line voltage is reduced sequentially over n sub word line voltages (n is a positive integer) during transition to the second word line voltage.

6. The memory device of claim 5, wherein the transition control unit generates the first control signal so that the second word line voltage is linearly increased during transition to the first word line voltage.

7. The memory device of claim 5, wherein the word line voltage supplying unit comprises a voltage divider that divides the first word line voltage sequentially to the n sub word line voltages in response to the first control signal.

8. The memory device of claim 1, wherein each of the first and second memory cells comprises a transistor and a capacitor,
wherein the transistors of the first and second memory cells share an active area, and
wherein gates of the transistors of the first and second memory cells are respectively connected to the first and second word lines.

9. The memory device of claim 8, wherein the transition control unit generates the first control signal so that electrons accumulated in the transistor of the first memory cell are blocked from moving to one end of the transistor of the second memory cell before the word line voltage of the first word line is transitioned from the first word line voltage to the second word line voltage.

10. The memory device of claim 1, wherein each of the first and second memory cells comprises a transistor and a capacitor,
wherein the transistors of the first and second memory cells are separately formed on active areas spaced apart from each other, and
wherein gates of the transistors of the first and second memory cells are respectively connected to the first and second word lines.

11. The memory device of claim 10, wherein the transition control unit generates the first control signal so that electrons accumulated in an element isolation region separating the first and second memory cells are blocked from moving to one end of the transistor of the second memory cell before the word line voltage of the first word line is transitioned from the first word line voltage to the second word line voltage.

12. The memory device of claim 1, wherein the memory device is a DRAM device, and
wherein gates of transistors of the first and second memory cells comprise recessed gates.

13. The memory device of claim 1, wherein the memory device is a DRAM device, and
wherein each of gates of transistors of the first and second memory cells includes a fin partially contacting a side surface of an active area of a substrate where the transistor is formed, and extending to a field area.

14. A memory device comprising:
a memory cell array comprising first and second neighboring word lines, a first memory cell connected to the first word line, and a second memory cell connected to the second word line the second memory cell neighboring positioned adjacent the first memory cell;
a word line voltage supplying unit that transitions a word line voltage of the first word line from a first word line voltage to a second word line voltage, in response to a first control signal; and
a transition control unit that generates the first control signal, the first control signal controlling a transition period of the word line voltage during a transition of the word line voltage from the first word line voltage to the second word line voltage so that a transition waveform profile from the first word line voltage to the second word line voltage is different than a transition waveform profile from the second word line voltage to the first word line voltage;
wherein the first word line voltage is a selected word line voltage and the second word line voltage is a non-selected word line voltage, and
wherein the transition control unit generates the first control signal so that a time period taken to transition the first word line voltage to the second word line voltage is longer than a time period taken to transition the second word line voltage to the first word line voltage.

15. The memory device of claim 14 wherein the transition waveform profile comprises a rate of increase or decrease of the word line voltage; and wherein the rate of decrease of the word line voltage from the first word line voltage to the second word line voltage is less in absolute value than the rate of increase of the word line voltage from the second word line voltage to the first word line voltage.

16. The memory device of claim 14 wherein the transition waveform profile comprises a reduction of the word line voltage from the first word line voltage to the second word line voltage incrementally over a sequence of sub-word-line voltages.

17. The memory device of claim 14, wherein the transition control unit generates the first control signal so that electrons accumulated in the transistor of the first memory cell are blocked from moving to one end of the transistor of the second memory cell before the word line voltage of the first word line is transitioned from the first word line voltage to the second word line voltage.

18. The memory device of claim 14, wherein the transition control unit generates the first control signal so that electrons accumulated in an element isolation region separating the first and second memory cells are blocked from moving to one end of the transistor of the second memory cell before the word line voltage of the first word line is transitioned from the first word line voltage to the second word line voltage.

* * * * *